United States Patent [19]

Arimoto et al.

[11] Patent Number: 5,185,744
[45] Date of Patent: Feb. 9, 1993

[54] SEMICONDUCTOR MEMORY DEVICE WITH TEST CIRCUIT

[75] Inventors: Kazutami Arimoto; Kazuyasu Fujishima; Yoshio Matsuda; Tsukasa Ooishi; Masaki Tsukude, all of Hyogo, Japan

[73] Assignee: Mitsubishi Denki Kabushiki Kaisha, Tokyo, Japan

[21] Appl. No.: 479,568

[22] Filed: Feb. 14, 1990

[30] Foreign Application Priority Data

Aug. 18, 1989 [JP] Japan .................................. 1-213560

[51] Int. Cl.$^5$ ............................................. G11C 29/00
[52] U.S. Cl. .................................. 371/21.2; 371/21.3; 371/21.1
[58] Field of Search ................. 371/21.2, 21.3, 21.1; 365/201

[56] References Cited

U.S. PATENT DOCUMENTS

| 4,464,750 | 8/1984 | Tatematsu ........................... 371/21.2 |
| 4,541,090 | 9/1985 | Shiragasawa ....................... 371/21.2 |
| 4,654,827 | 3/1987 | Childers .............................. 365/201 |
| 4,654,849 | 3/1987 | White, Jr. et al. ..................... 371/21 |
| 4,670,878 | 6/1987 | Childers .............................. 371/21.1 |
| 4,744,061 | 5/1988 | Takemae et al. ............... 371/21.2 X |
| 4,771,407 | 9/1988 | Takemae et al. ..................... 365/226 |
| 4,841,525 | 6/1989 | Lieske et al. ........................... 371/21 |
| 4,873,669 | 10/1989 | Furutani ........................... 365/201 X |
| 4,899,313 | 2/1990 | Kumanoya et al. ................. 365/201 |
| 5,016,220 | 5/1991 | Yamagata ........................... 365/201 |
| 5,022,007 | 6/1991 | Arimoto et al. ..................... 365/201 |

FOREIGN PATENT DOCUMENTS 0206486 7/1986 European Pat. Off. .
264893 4/1988 European Pat. Off. .

OTHER PUBLICATIONS

Matsumura et al., "On-Chip Parallel Testing Technology for VLSI Memories," IEEE Solid-State Circuits Conference, 1985, p. 240.

Inoue et al., "Parallel Testing Technology for VLSI Memories," 1987 International Test Conference, Paper 45.1, pp. 1066-1071.

Shah et al., "A 4Mb DRAM with Cross-point Trench Transistor Cell" IEEE Solid-State Circuits Conference, 1986, pp. 268.

Mano et al., "Circuit Technologies for 16Mb DRAMS," IEEE Solid-State Circuits Conference, 1987.

Kumanoya et al., "A 90ns DRAM with Multi-Bit Test Mode," IEEE Solid-State Circuits Conference, 1985, pp. 240, 241 & 352.

Ohsawa et al., "A 60ns 4Mb CMOS DRAM with Built--in Self-Test," IEEE Solid-State Circuits Conference, 1987, pp. 286, 287 & 430.

Takeshima et al., "A 55ns 16Mb DRAM," IEEE Solid-State Circuits Conference, 1989, pp. 246-247.

Arimoto et al., "A 60ns 3.3V 16Mb DRAM," IEEE Solid-State Circuits Conference, 1989, pp. 244-245.

Primary Examiner—Stephen M. Baker
Assistant Examiner—Ly V. Hua
Attorney, Agent, or Firm—Lowe, Price, LeBlanc & Becker

[57] ABSTRACT

A semiconductor memory device comprises a plurality of memory array blocks (B1 to B4). In each of the plurality of memory array blocks (B1 to B4), a line mode test is performed. Results of the line mode tests performed in the memory array blocks (B1 to B4) are outputted to corresponding match lines (ML1 to ML4). A flag compress (30) performs a logic operation on the test results outputted to the plurality of match lines (ML1 to ML4) and outputs the operation results as test results for the plurality of memory array blocks (B1 to B4) to the outside.

40 Claims, 19 Drawing Sheets

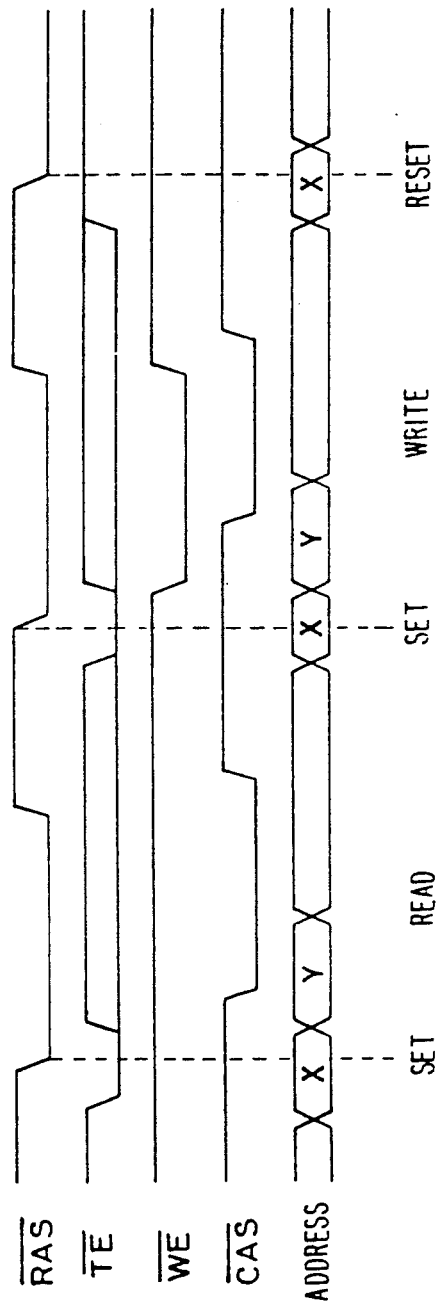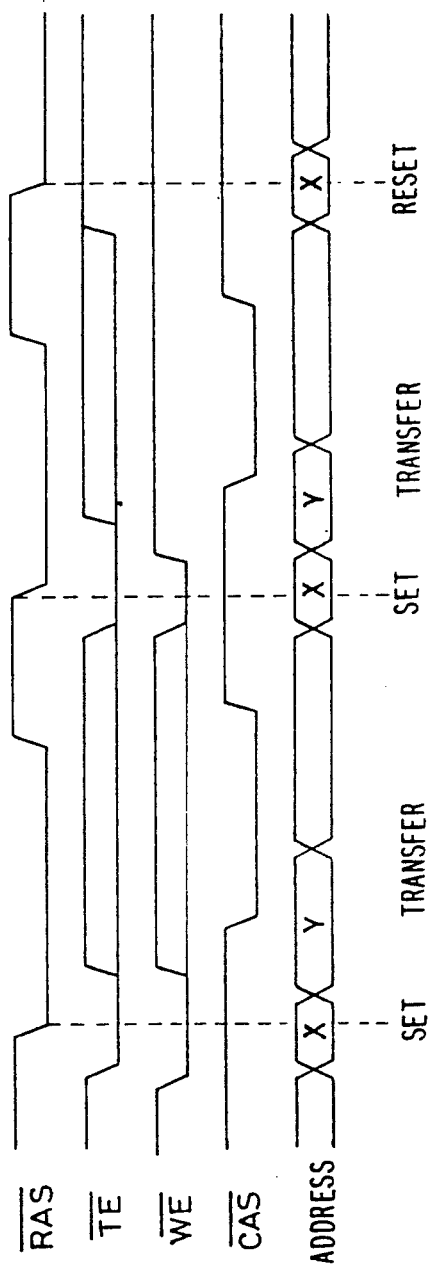

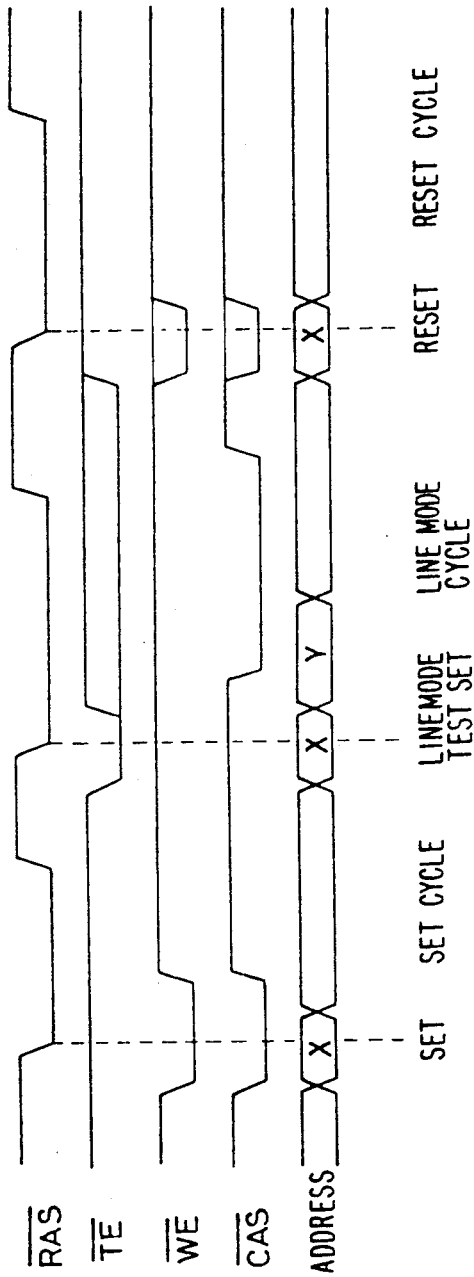
FIG.9 (LINE READ MODE)
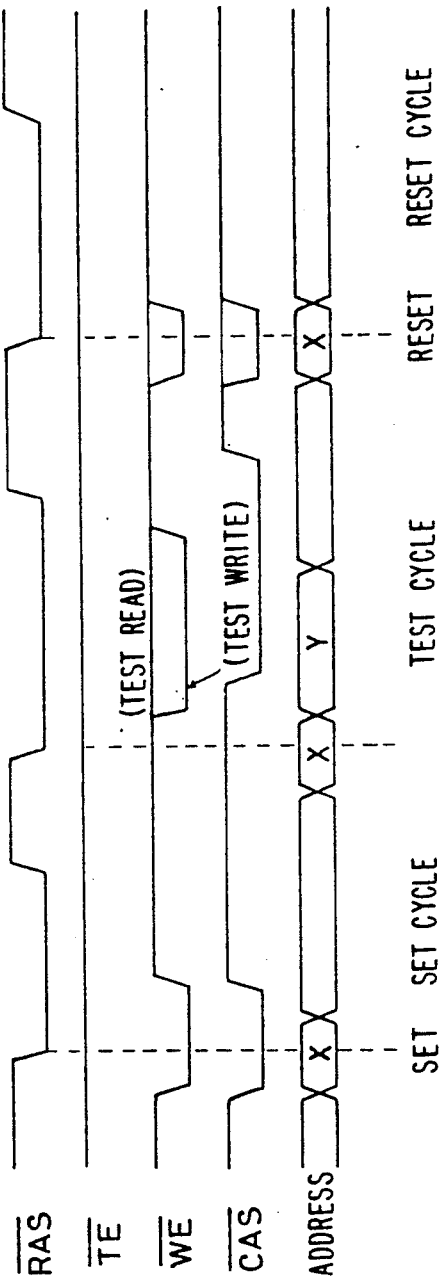
FIG.10 (MULTI-BIT TEST)

(TEST MODE SET CYCLE)

(TEST MODE RESET CYCLE)

FIG.19B  PRIOR ART

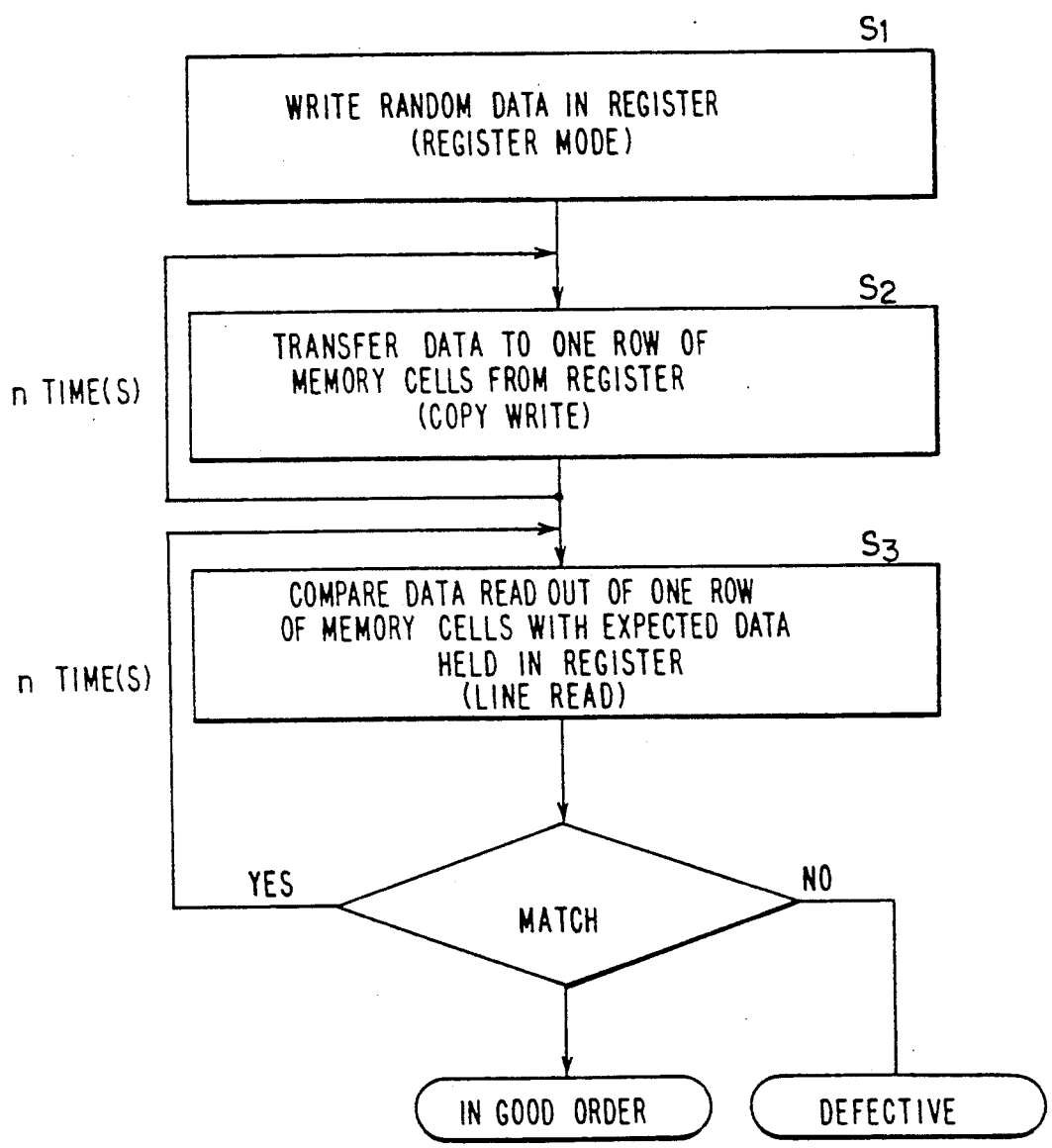

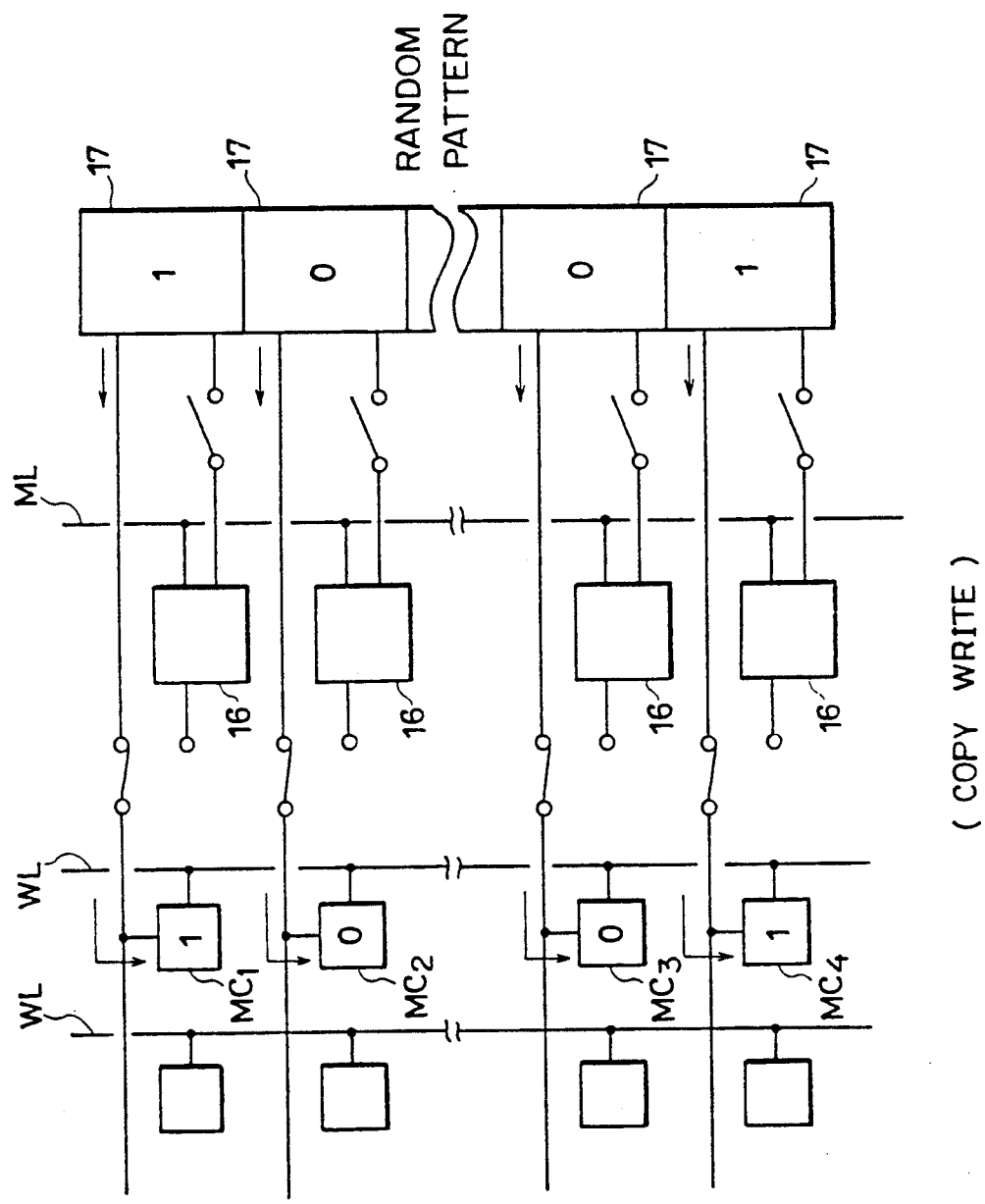

SEMICONDUCTOR MEMORY DEVICE WITH TEST CIRCUIT

CROSS REFERENCE TO RELATED APPLICATION

This application is related to copending application Ser. No. 400, 899, filed Aug. 30, 1989, commonly assigned with the present invention.

BACKGROUND OF THE INVENTION

1. Field of the Invention

The present invention generally relates to semiconductor memory devices, and more particularly, to a semiconductor memory device with a test circuit which can simultaneously test a plurality of memory cells.

2. Description of the Background Art

FIG. 19A is a block diagram showing a structure of a conventional semiconductor memory device with a test circuit. The semiconductor memory device shown in FIG. 19A is described, for example, in ISSCC85 Dig. of Tech. Papers pp. 240-241 by M. Kumanoya, et al..

In FIG. 19A, a memory array 1 comprises a plurality of memory cells arranged in a plurality of rows and columns. This memory array 1 is divided into four memory array blocks B1 to B4. Input/output line pairs I01 to I04 are provided corresponding to the memory array blocks B1 to B4, respectively. The memory array 1 is provided with row decoders 2a and 2b for selecting a row, and with column decoders 3a and 3b for selecting a column.

On the other hand, address signals A0 to An are applied to an address buffer 4 from outside. Further, an external row address strobe signal $\overline{RAS}$, an external column address strobe signal $\overline{CAS}$ and an external write enable signal $\overline{WE}$ are applied to a RAS buffer 5, a CAS buffer 6 and a WE buffer 7, respectively.

The address buffer 4 is responsive to the strobe signal $\overline{RAS}$ from the RAS buffer 5 to apply the address signals A0 to An from outside to the row decoders 2a and 2b as row address signals. The row decoder 2a is responsive to the row address signals for selecting one row in each of the memory array blocks B1 and B3. The row decoder 2b is responsive to the row address signals for selecting one row in each of the memory array blocks B2 and B4. Furthermore, the address buffer 4 is responsive to the strobe signal $\overline{CAS}$ from the CAS buffer 6 for applying the address signals A0 to An from outside to the column decoders 3a and 3b as column address signals. The column decoder 3a is responsive to the column address signals for selecting one column in each of the memory array blocks B1 and B2. The column decoder 3b is responsive to the column address signals for selecting one column in each of the memory array blocks B1 and B2. The column decoder 3b is responsive to the column address signals for selecting one column in each of the memory array blocks B3 and B4.

In normal reading or writing, a switch 9 is switched to the side of a contact a. In reading, one memory cell is selected in each of the memory array blocks B1 to B4. Data having been stored in the four selected memory cells are applied to preamplifiers PA1 to PA4 through the input/output line pairs I01 to I04, respectively. One of transistors T1 to T4 is turned on by a block selector 8. This permits the data amplified by any one of the preamplifiers PA1 to PA4 to be outputted as output data $D_{out}$ through the switch 9 and an output buffer 11 to the external.

Also in writing, one of the transistors T1 to T4 is turned on by the block selector 8. This permits input data $D_{in}$ having been externally applied to a Din buffer 12 to be written in a selected memory cell in any one of the memory array blocks through the corresponding input/output line pair I01 to I04. Meanwhile, the selection of reading or writing is made by the external write enable signal $\overline{WE}$ applied to the WE buffer 7.

In the semiconductor memory device of FIG. 19A, a multi-bit test mode is available for reducing test time. This multi-bit test mode is controlled by externally applying a test enable signal $\overline{TE}$ to a test control circuit 10. In testing, the switch 9 is switched to the side of a contact b by the test control circuit 10.

In writing of test data, all of the transistors T1 to T4 are turned on by a multi-bit write control circuit 13. This allows externally applied test data to be simultaneously written in the memory array blocks B1 to B4 through the $D_{in}$ buffer 12 and the input/output line pairs I01 to I04.

On the other hand, in test data reading, test data having been read out of the memory array blocks B1 to B4 through the input/output line pairs I01 to I04 are amplified by the preamplifiers PA1 to PA4 before entered into an exclusive OR circuit 14. If the four data match with each other, the exclusive OR circuit 14 outputs a flag of "H", or otherwise if any one mismatch exists between the four data, it outputs a flag of "L". The output of the exclusive OR circuit 14 is extracted to the outside through the switch 9 and the output buffer 11.

More specifically, if test data of four "L"-bits have been entered into the memory array 1, outputs of the preamplifiers PA1 to PA4 will be all "L" except there exists any defective memory cell in the memory array 1, so that the exclusive OR circuit 14 outputs a flag of "H". Also, when test data of four "H"-bits have been entered, a flag of "H" will be outputted likewise if there are no deficiency in all of the memory cells. By contrast, if there exists any deficiency in the memory cells of the memory array 1, the read-out data will contain "H" and "L" mixed up even when the same data have been written in all the memory cells. This leads to output of a "L" flag by the exclusive OR circuit 14.

According to the multi-bit test mode above, execution time of the test is reduced to a quarter as compared with other test methods where test data are written in and read out of each memory cell one by one.

With the recent development in large-capacity semiconductor memory devices, however, the test time has been evidently increased. Therefore, according to the conventional multi-bit test mode, satisfying reduction in test time and thus in test cost can hardly be achieved any longer.

Therefore, as a technique which allows a drastic reduction in test time as compared with the conventional multi-bit test mode, a line mode test in has been proposed.

In an article by J. Inoue et al., entitled "PARALLEL TESTING TECHNOLOGY FOR VLSI MEMORIES", ITC Proceedings., 1987, pp. 1066–1071; an article entitled "TECHNOLOGY FOR INCREASING TEST EFFICIENCY SUITABLE FOR VERY LARGE CAPACITY MEMORIES", 1987 National Conference 165 of Semiconductor Materials Section of Institute of Electronics, Information and Communication Engineers of Japan, pp. 166, the line mode test is disclosed. All memory cells connected to a word line are simultaneously tested by introducing an on-chip test circuit.

FIG. 19B is a circuit diagram showing a structure of a memory comprising an on-chip test circuit shown in the latter document.

First, for example, "H" and "L" level data are respectively applied to the write lines W and $\overline{W}$, and a potential on the write control line WC is raised to the "H" level. Consequently, the transistors Q11 to Q14 are turned on, so that potentials on the bit lines $\overline{B1}$ and $\overline{B2}$ become the "H" level and the potentials on the bit lines B1 and B2 become the "L" level. When a potential on the word line WL1 is raised to the "H" level, "H" level data are respectively written into memory cells M1 and M3. After writing, the potentials on the word line WL1 and the write control line WC are brought to the "L" level.

Thereafter, when the potential on the word line WL1 is raised to the "H" level, the data stored in the memory cells M1 and M3 are respectively read out onto the bit lines B1 and B2. Data on the bit line pairs B1, $\overline{B1}$ and B2, $\overline{B2}$ are amplified by a sense amplifier (not shown). Then, "L" and "H" level data are respectively applied to the write lines W and $\overline{W}$.

When the data read out from the memory cells M1 and M3 are at the "H" level, the potentials on the bit lines B1 and B2 become the "H" level, and the potentials on the bit lines $\overline{B1}$ and $\overline{B2}$ become the "L" level. Consequently, the transistors Q15 and Q17 are turned on, so that both potentials of nodes N11 and N12 become the "L" level. Therefore, the transistors Q19 and Q20 are turned off, so that the node N13 precharged in advance by the precharge circuit 110 is not discharged. Thus, an "L" level flag signal is outputted to a detection signal output line DS.

It is assumed here that the memory cell M1, for example, is defective. In this case, the data read out from the memory cells M1 and M3 respectively become the "L" and "H" levels, although "H" level data were written in the memory cells M1 and M3. Consequently, the potentials on the bit lines B1 and $\overline{B1}$ respectively become the "L" and "H" levels. When "L" and "H" level data are respectively applied to the write lines W and $\overline{W}$, the transistor Q16 is turned on, so that the node N11 is charged at the "H" level. Consequently, the transistor Q19 is turned on, so that the node N13 is discharged at the "L" level. As a result, an "H" level flag signal indicating an error is outputted from the detection signal output line DS.

As described in the foregoing, in the above described line mode test, data are applied to the write lines W and $\overline{W}$ and then, the data are written into a row of memory cells connected to a selected word line. As a result, the same data are written in the row of memory cells. The data are read out from the row of memory cells, and data opposite to the data previously applied to the write lines W and $\overline{W}$ are respectively applied to the write lines W and $\overline{W}$. When data read out from a row of memory cells all match data previously written in the row of memory cells, an "L" level flag signal is outputted from the detection signal output line DS. On the other hand, when at least one memory cell out of a row of memory cells connected to one word line is defective so that data read out from the memory cell does not match data previously written in the memory cell, an "H" level flag signal is outputted from the detection signal output line DS.

According to this line mode test, all the memory cells connected to one word line are simultaneously tested, and this enables a simultaneous test of a larger number of bits than in the case of the multi-bit test mode. Accordingly, a considerable reduction in test mode can be expected.

In recent years, semiconductor memory devices have come to be implemented largely as having a four-bit word organization (X4 organization), an eight-bit word organization (X8 organization) and the like on the same chip as well as a one-bit word organization (X1 organization) only. Accordingly, additional test mode circuits corresponding to those organizations are required. In order to apply the above-mentioned line mode test to a variety of semiconductor memory devices, provision of peripheral circuits such as I/O control circuit and test mode setting circuit that have been adapted to the respective semiconductor memory devices is desired.

However, it can hardly be said that specific techniques for applying the line mode test to a variety of semiconductor memory devices, and such peripheral circuits or the like have been fully developed.

SUMMARY OF THE INVENTION

An object of the present invention is to establish an environment where test means capable of testing a plurality of bits at a time can be applied according to types of semiconductor memory devices, and thus reduce the test time considerably.

Another object of the present invention is to provide techniques for applying the line mode test to a variety of semiconductor memory devices.

Still another object of the present invention is to provide peripheral circuits for applying the line mode test to a semiconductor memory device of a one-bit word organization.

A further object of the present invention is to provide peripheral circuits for applying the line mode test to a semiconductor memory device of a multi-bit word organization.

Still a further object of the present invention is to provide peripheral circuits for applying the line mode test to a semiconductor memory device which can be selectively switched between a one-bit and a multi-bit word organizations.

A semiconductor memory device according to the present invention comprises a memory array, a plurality of test circuits and a logic circuit. The memory array comprises a plurality of memory cells arranged in a matrix and is divided into a plurality of blocks. The plurality of test circuits are provided corresponding to the plurality of blocks, each testing a plurality of memory cells in the corresponding block simultaneously. The logic circuit performs a predetermined logical operation on a plurality of test results of the plurality of test circuits to output test results for all of the blocks.

In the semiconductor memory device according to the present invention, the plurality of memory cells in each of the plurality of blocks are simultaneously tested. A predetermined logical operation is further performed on the plurality of test results in the plurality of blocks, outputting its results as test results for all of the blocks. This means that the plurality of memory cells in the plurality of blocks are tested in parallel, so that the test time is further reduced.

According to another aspect of the present invention, a semiconductor memory device from and to which information of a multi-bit word organization can be read out and written in comprises a memory array, a plurality of test circuits and a plurality of test result output circuits. The memory array comprises a plurality of memory cells arranged in a matrix and is divided into a plurality of blocks corresponding to the plurality of bits. The plurality of test circuits are provided corresponding to the plurality of blocks, each simultaneously testing the plurality of memory cells in the corresponding block. The plurality of test result output circuits output a plurality of test results of the plurality of test circuits.

In this semiconductor memory device, the plurality of memory cells in each of the plurality of blocks corresponding to the plurality of bits are simultaneously tested. The plurality of test results of the plurality of blocks are outputted by the plurality of test result output circuits. In this manner, the semiconductor memory device from and to which information of a multi-bit word organization can be read out and written in allows output of test results corresponding to the plurality of bits.

According to still another aspect of the present invention, a semiconductor memory device from and to which information of a multi-bit word organization can be read out and written in comprises a memory array, a plurality of input/output circuits, a plurality of test circuits and a plurality of test result output circuits. The memory array comprises a plurality of memory cells arranged in a matrix and is divided into a plurality of blocks. The plurality of input/output circuits are provided corresponding to the plurality of bits. Each memory cell comprised in each block is connected to any of the plurality of input/output circuits. The plurality of test circuits are provided corresponding to the plurality of input/output circuits, each simultaneously testing the plurality of memory cells connected to the corresponding input/output circuit. The plurality of test result output circuits are provided corresponding to the plurality of input/output circuit to output a plurality of test result of the plurality of test circuits.

In this semiconductor memory device, the plurality of test results of the plurality of test circuits corresponding to the plurality of input/output circuits are outputted by the plurality of test result output circuit. In this manner, the semiconductor memory device with the blocks from and to which information is read out and written in through the plurality of input/output circuits allows output of the test results corresponding to the plurality of bits.

BRIEF DESCRIPTION OF THE DRAWINGS

FIG. 7 is a timing chart for explaining sequence of set and reset in a register mode.

FIG. 8 is a timing chart for explaining sequence of set and reset in a copy write mode.

FIG. 9 is a timing chart for explaining sequence set and reset in a line read mode.

FIG. 10 is a timing chart for explaining sequence of set and reset in a multi-bit test.

FIG. 19B is a circuit diagram showing a structure of a conventional semiconductor memory device comprising an on-chip test circuit.

FIG. 23 is a flow chart for explaining the line mode test.

FIG. 24A is a diagram for explaining copy write in the line mode test.

DESCRIPTION OF THE PREFERRED EMBODIMENTS

In the following, embodiments of the present invention will be described in detail with reference to the accompanying drawings.

Figure 20:
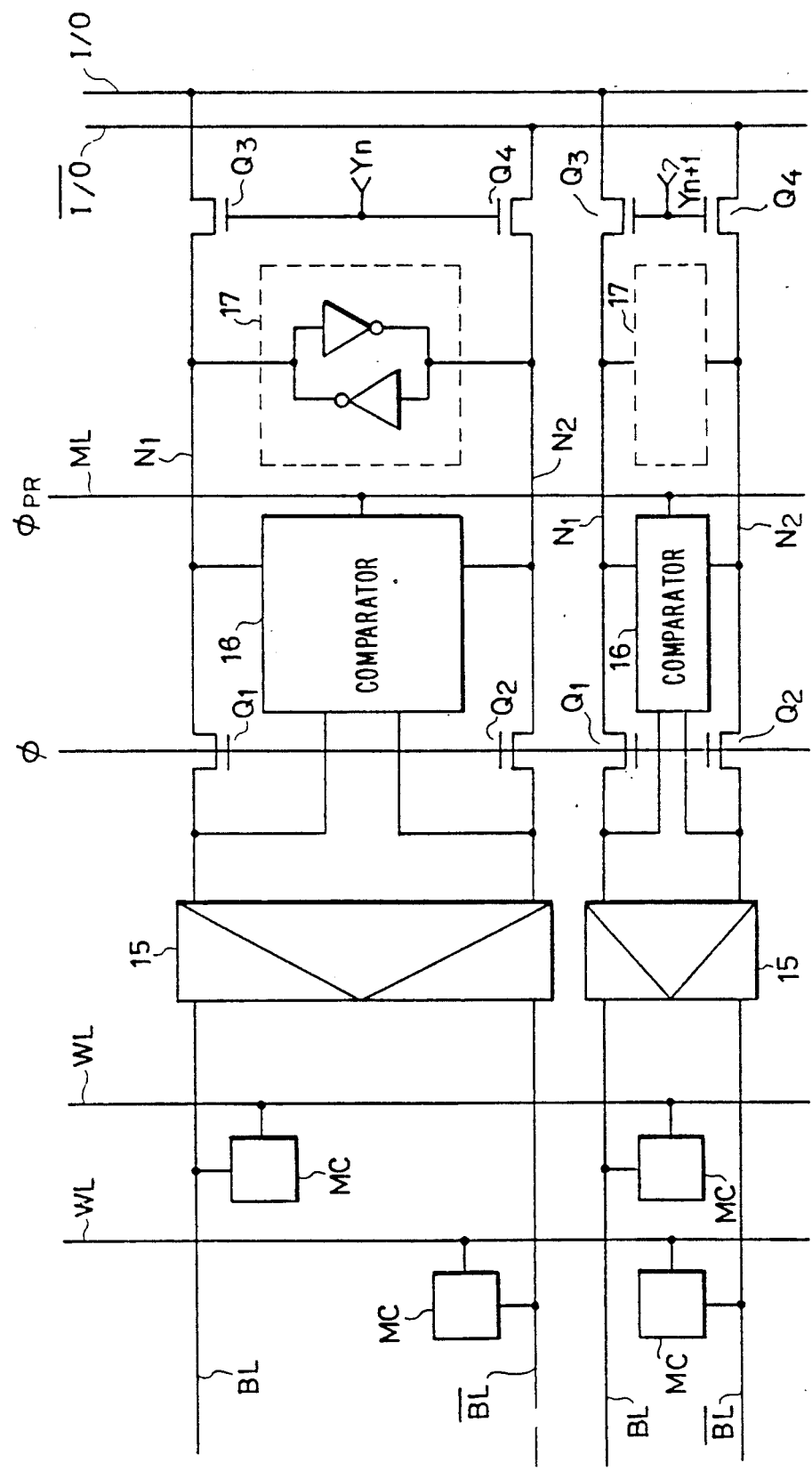
FIG. 20 is a circuit diagram showing a specific structure of a memory array for explaining a line mode test.

First, the line mode test will be described. FIG. 20 is a circuit diagram for explaining the line mode test which is disclosed in the copending U.S. application Ser. No. 400,899, filed Aug. 30, 1989, and K. Arimoto et al., "DYNAMIC RAMs", ISSCC 89 Dig. of Tech. Papers, pp. 244–245; Feb. 17, 1989. The latter publication was published by the same inventors as those of the present invent‥ n and thus should not be considered as the prior art.

In FIG. 20, a plurality of bit line pairs BL and $\overline{BL}$ and a plurality of word lines WL are arranged to intersect with each other and memory cells MC are provided at their intersections. A sense amplifier 15 is connected to each of the bit line pairs BL and $\overline{BL}$. Further, the bit lines BL and $\overline{BL}$ are connected to nodes N1 and N2 through transfer transistors Q1 and Q2, respectively.

Between the nodes N1 and N2 there are connected a comparator 16 and a register 17. Each register 17 comprises two inverters connected anti-parallel with each other. Each register 17 has expected data latched therein. Each comparator 16 detects match or mismatch between the expected data latched in the register 17 and data read out of the memory cells MC onto the bit line pair BL and $\overline{BL}$. Commonly to a plurality of comparators 16, there is connected a match line for outputting results of the line test.

The nodes N1 and N2 are connected to input/output lines I/O and $\overline{I/O}$ through transfer transistors Q3 and Q4, respectively.

The transfer transistors Q1 and Q2 are controlled by a control signal $\phi$. Meanwhile, the transfer transistors Q3 and Q4 corresponding to one bit line pair BL and $\overline{BL}$ are controlled by a column decode signal Yn from a column decoder. The transfer transistors Q3 and Q4 corresponding to the adjacent another bit line pair BL and $\overline{BL}$ are controlled by a column decode signal Yn+1 from the column decoder.

Secondly, operation in the line mode test will be described with reference to FIGS. 21 and 22.

Figure 21:
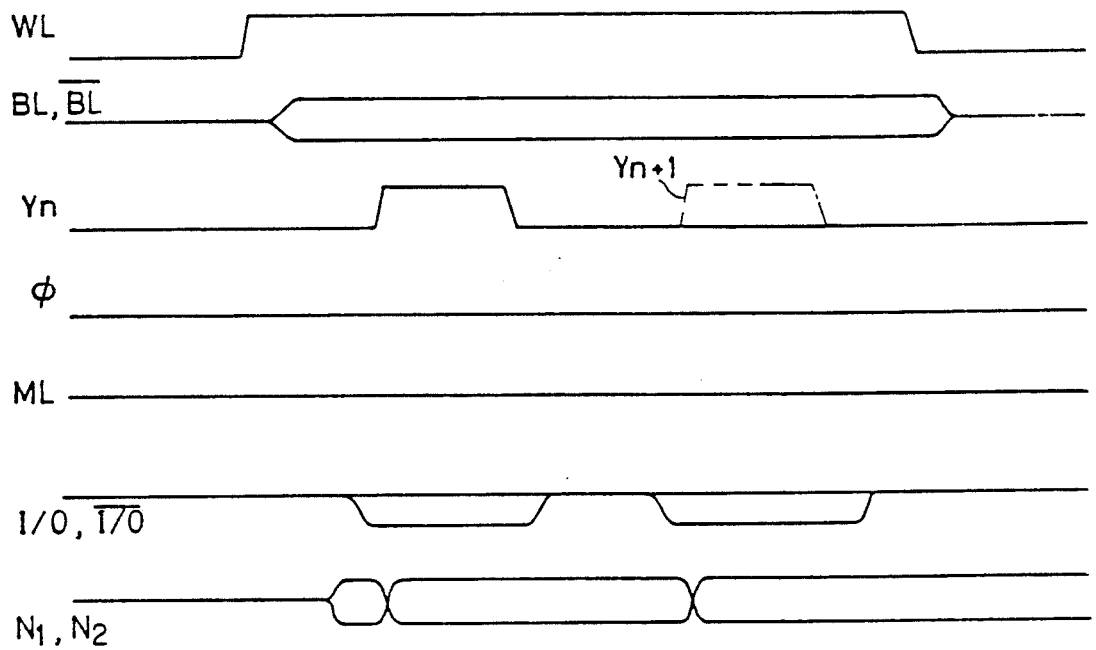
FIG. 21 is a timing chart for explaining a register mode operation in the line mode test.

FIG. 21 is a timing chart for explaining an operation of writing expected data into the register 17. The writing operation of expected data into the register 17 is referred to as a register mode.

Initially, potential of one of the plurality of word lines WL rises to the "H" level. This causes the data stored in the memory cells MC connected to the word line WL to be read out on the corresponding bit lines BL or $\overline{BL}$. Each of the sense amplifier 15 then comes into operation to amplify potential difference between the corresponding bit lines BL and $\overline{BL}$.

Following the above, complementary expected data are applied to the input/output line pair I/O and $\overline{I/O}$. When the column decode signal Yn rises to the "H" level, the corresponding transfer transistors Q3 and Q4 are turned on, connecting the corresponding nodes N1 and N2 to the input/output line pair I/O and $\overline{I/O}$. As a result, the expected data on the input/output line pair I/O and $\overline{I/O}$ are transmitted to the corresponding nodes N1 and N2. Subsequently, new expected data are applied to the input/output line pair I/O and $\overline{I/O}$. When the column decode signal Yn+1 rises to the "H" level, the corresponding transfer transistors Q3 and Q4 are turned on, connecting the corresponding nodes N1 and N2 to the input/output line pair I/O and $\overline{I/O}$. As a result, the expected data on the input/output line pair I/O and $\overline{I/O}$ are transmitted to the corresponding nodes N1 and N2. In this manner, random expected data are written into a plurality of registers 17. Meanwhile, in this case, refresh operation is performed for the memory cells MC.

Figure 22:
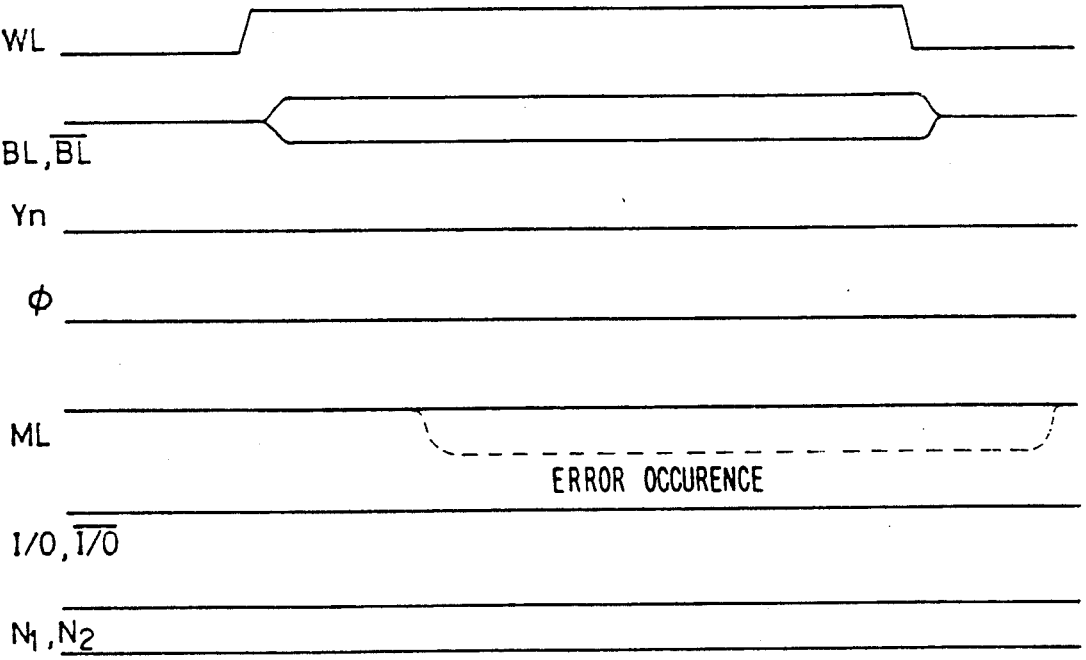
FIG. 22 is a timing chart for explaining a line read operation in the line mode test.

FIG. 22 is a timing chart for explaining a match detecting operation. This match detecting operation is referred to as line read.

Initially, potential of one of the plurality of word lines WL rise to the "H" level. This causes the data stored in the memory cells MC connected to the word line to be read out on the corresponding bit line BL or $\overline{BL}$. Each of the sense amplifiers 15 then comes into operation to amplify potential difference between the corresponding bit lines BL and $\overline{BL}$. Subsequently, each of the comparators 16 compares the data read out on the corresponding bit line pair BL and $\overline{BL}$ from the memory cells MC and the expected data held in the corresponding register 17.

A plurality of outputs of the comparator 16 are connected to the match line ML in a wired OR manner. Meanwhile, the match line ML has been precharged to the "H" level. When the data read out of the memory cells MC onto the data bit line pair BL and $\overline{BL}$ do not match with the expected data held in the corresponding register 17, potential of the match line ML is discharged to the "L" level.

In other words, if at least one of the memory cells MC connected in one row to the one word line WL is defective, potential of the match line ML falls to the "L" level. On the other hand, if all the memory cells MC connected in one row to the one word line WL are normal, potential of the match line ML is held at the "H" level.

Subsequently, the transfer transistors Q1 and Q2 are turned on in response to the control signal $\phi$. This causes the data held in each of the registers 17 to be transferred to the corresponding bit line pair BL and $\overline{BL}$. The data on the bit line pair BL and $\overline{BL}$ are written in the memory cells MC connected to the selected one word line WL. By performing the above-mentioned operation for all of the word lines WL, data are written in the entire memory array.

The entire operation of the line mode test will be described with reference to FIGS. 23 to 24B.

In FIG. 24A, random data are written in the registers 17 (step S1 in FIG. 23). Subsequently, the data held in the registers 17 are transferred to the memory cells MC1 to MC4 connected in one row to one word line WL (step S2). The operation of step S2 is performed for all the word lines.

Figure 24B:
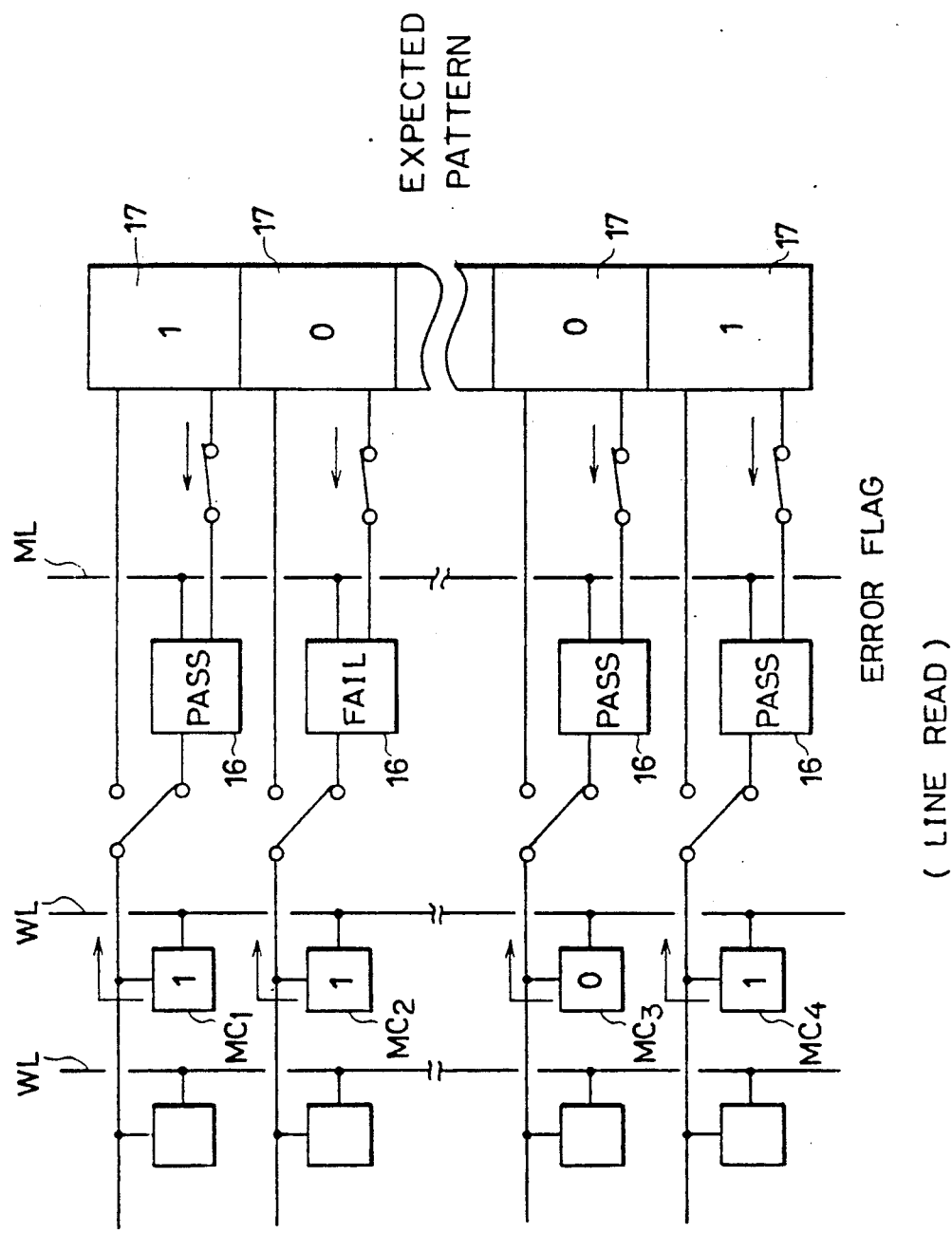
FIG. 24B is a diagram for explaining line read in the line mode test.

In FIG. 24B, the data read out of the memory cells MC1 to MC4 connected in one row to one word line WL are compared with the data (expected data) held in the registers 17 in the comparator 16 (step S3). In FIG. 24B, it is assumed that written data "0" of a memory cell MC2 have been inverted to "1" due to its deficiency. In this case, potential of the match line ML is discharged to the "L" level by the corresponding comparator 16. This causes the match line ML to output an error flag indicative of mismatch. The operation of step S3 is performed for all the word lines. This means that the data stored in all the memory cells are tested. In this manner, a line mode test based on an optional or random data pattern is performed.

Figure 1:
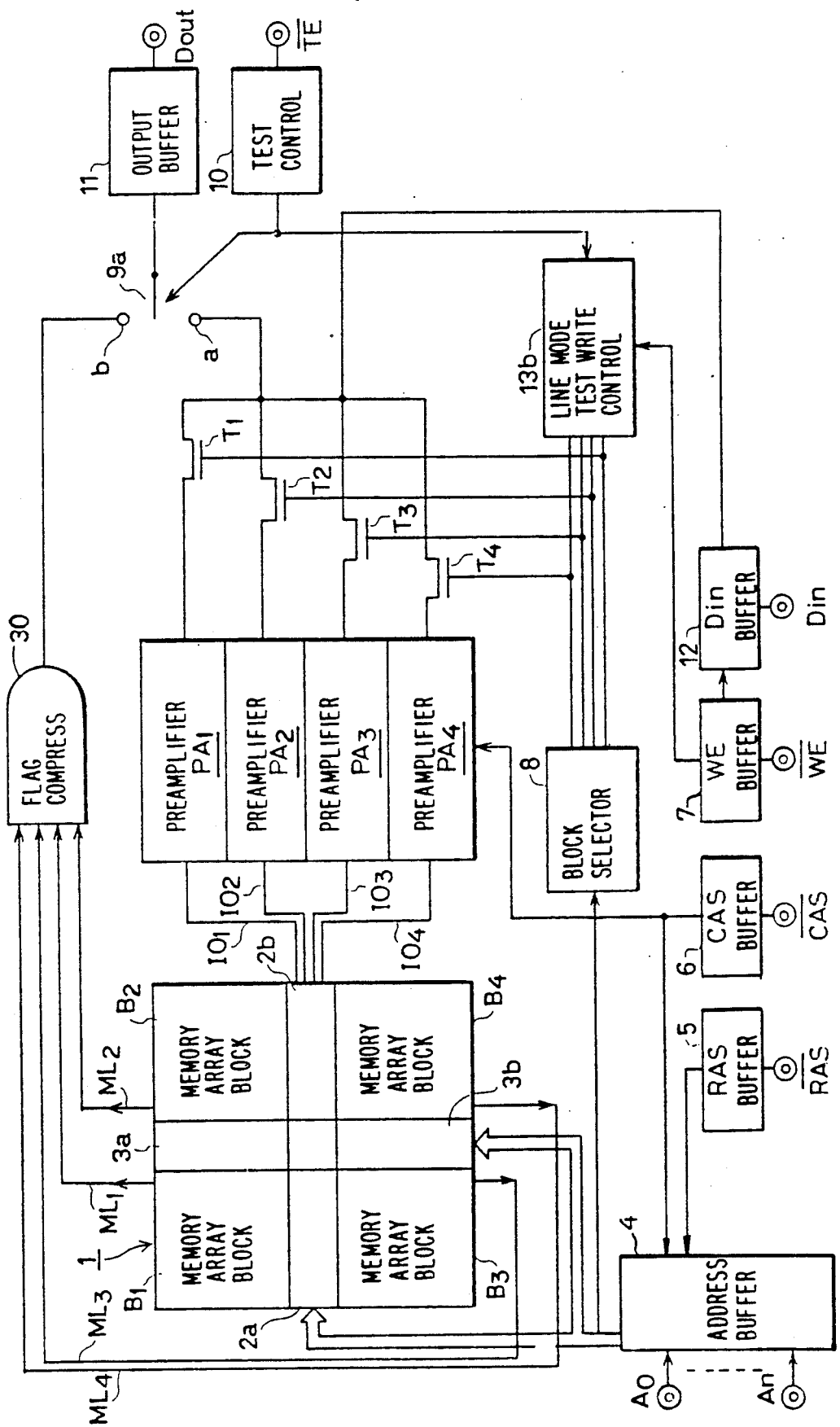
FIG. 1 is a block diagram showing the entire structure of a semiconductor memory device according to a first embodiment of the present invention.

FIG. 1 is a block diagram showing the entire structure of a semiconductor memory device according to a first embodiment of the present invention where the above-mentioned line mode test is applied. This semiconductor memory device is of a type from and to which data of a one-bit word organization (X1 organization) can be read out and written in.

In FIG. 1, a memory array 1 is divided into four memory array blocks B1 to B4. Each structure of the memory array blocks B1 to B4 is the same as that shown in FIG. 20. Four input/output line pairs 101 to 104 are provided corresponding to the memory array blocks B1 to B4. Furthermore, four match lines ML1 to ML4 are provided corresponding to the memory array blocks B1 to B4. The four match lines ML1 to ML4 are connected to input terminals of a flag compress 30 constituted of an AND circuit. An output terminal of the flag compress 30 is connected to a contact b of a switch 9a comprised of transistors.

In normal writing and reading, the switch 9a is switched to the side of a contact a, while the same is switched to the side of the contact b in the line mode test.

Figure 19A:
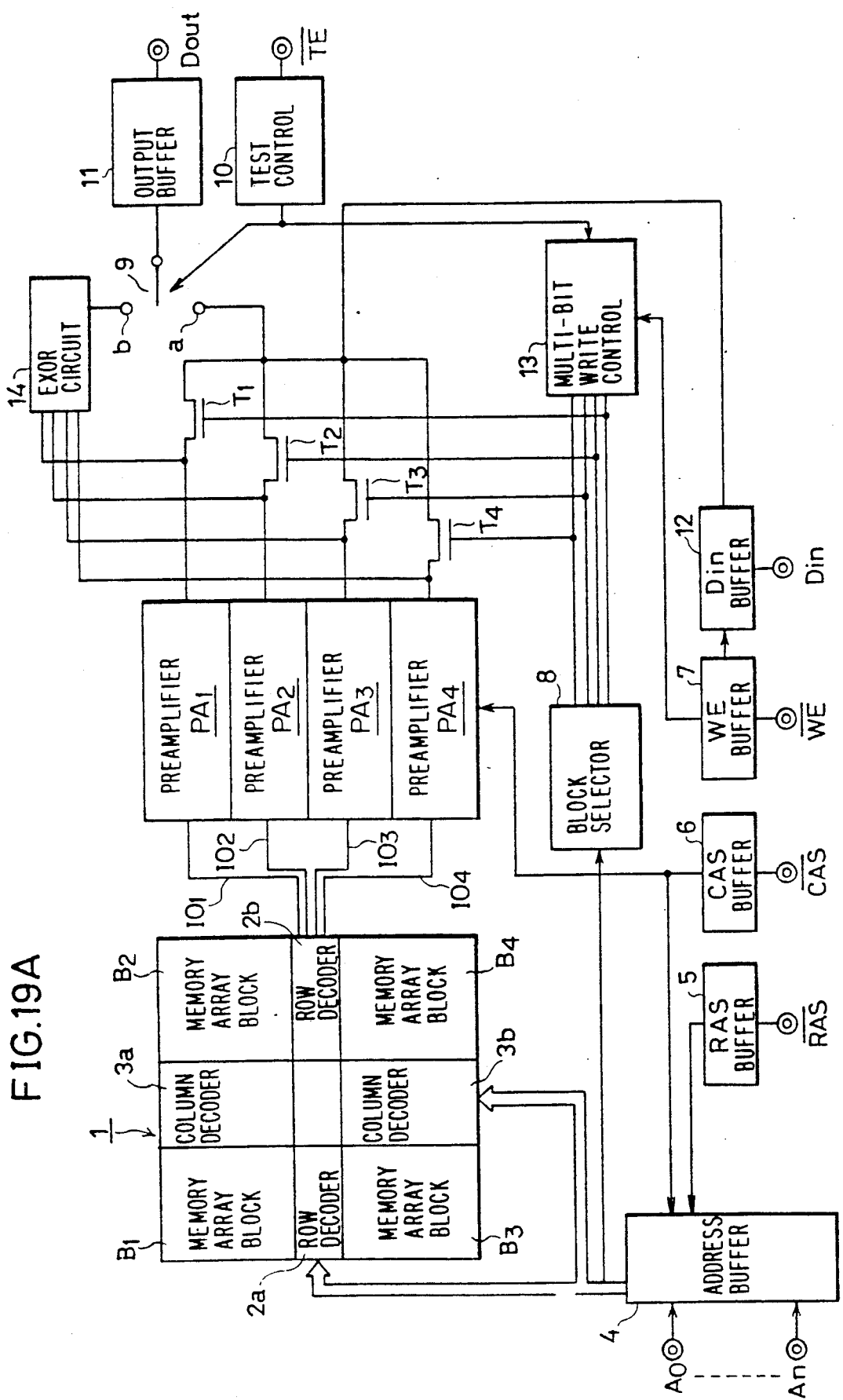
FIG. 19A is a block diagram showing the entire structure of a conventional semiconductor memory device capable of the multi-bit test.
Figure 19B:
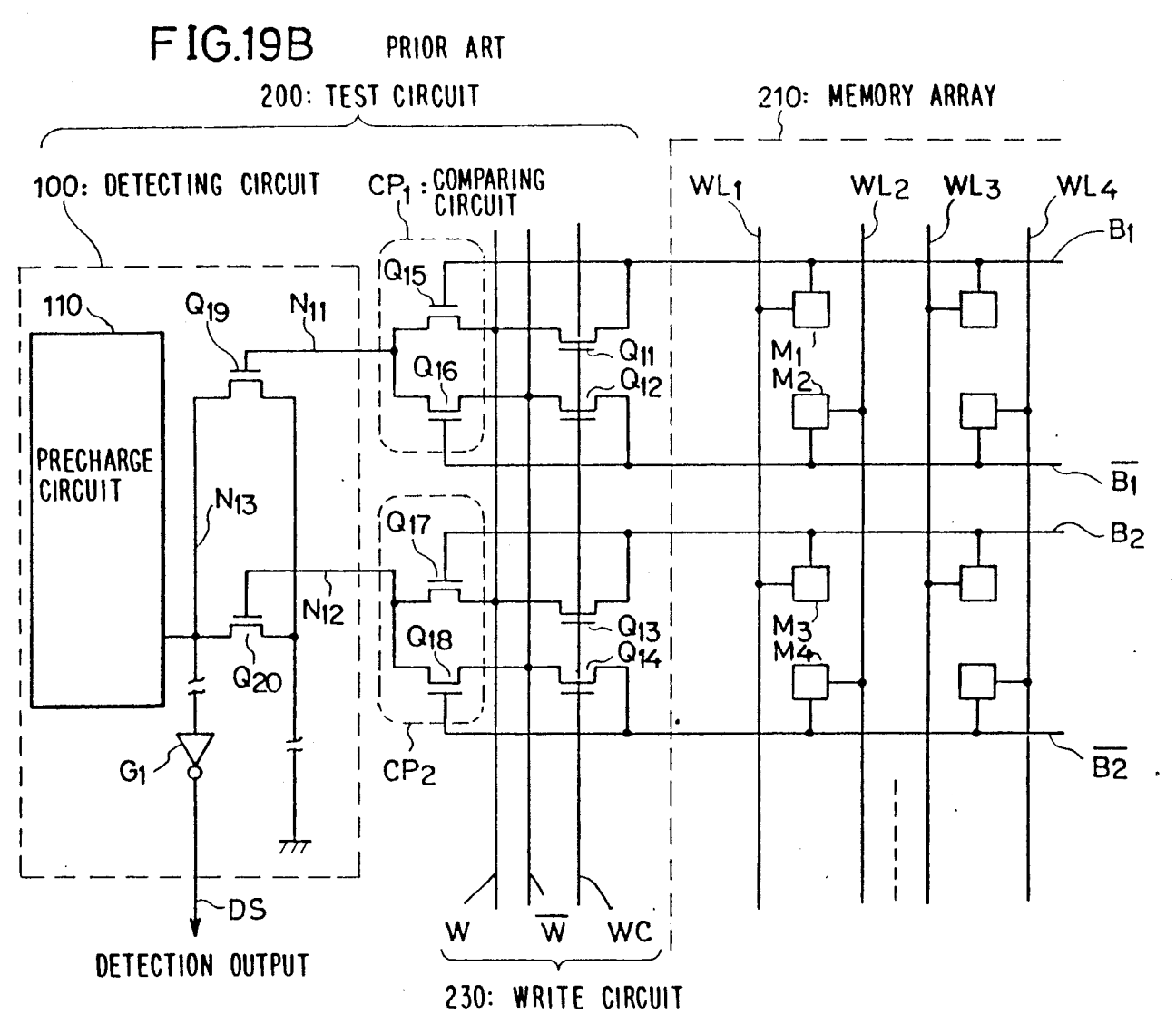

Meanwhile, in FIGS. 1 and 19, like numerals and characters are given to like portions of the semiconductor memory devices.

Furthermore, the normal writing and reading operations in the semiconductor memory device of FIG. 1 is the same as those in FIG. 19.

In the line mode test, all the transistors T1 to T4 are turned on by a line mode test write control circuit 13b. This causes externally applied test data to be written in the registers 17 (FIG. 20) in the four memory array blocks B1 to B4 through a $D_{in}$ buffer 12 and the four input/output line pairs I01 to I04. This means that four-bit test data are written in the memory array 1 in parallel. Thereafter, in the four memory array blocks B1 to B4, the test data held in the plurality of registers 17 are transferred to one row of memory cells MC in parallel.

The line mode test is performed for the four memory array blocks B1 to B4 at a time, outputting the test results to the corresponding match lines ML1 to ML4. The flag compress 30 performs AND operation on the four test results, results of which are outputted to the outside through an output buffer 11. When potentials of all the match lines ML1 to ML4 attain the "H" level, a flag "H" is outputted from the flag compress 30. This means that the test results of all the four memory array blocks B1 to B4 are right. On the other hand, when at least one of the match lines ML1 to ML4 is at the "L" level, a flag of "L" is outputted from the flag compress 30. This means that there exists deficiency in the memory array 1.

As described above, in the embodiment of FIG. 1, since the line mode test is performed in the four memory array blocks B1 to B4 in parallel, a further reduction in the test time can be achieved.

Figure 2:
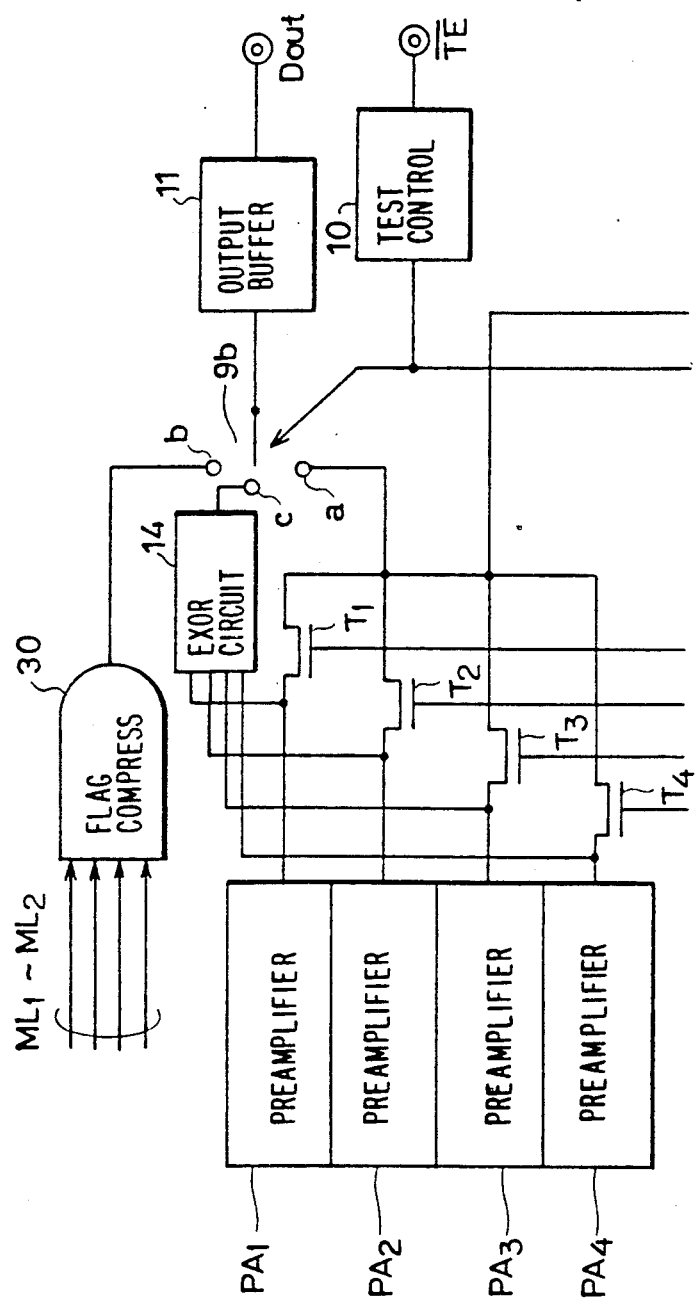
FIG. 2 is a block diagram showing a structure of the main part of a semiconductor memory device according to a second embodiment of the present invention.

FIG. 2 is a block diagram showing a structure of the main part of a semiconductor memory device according to a second embodiment of the present invention. What is different in the semiconductor memory device of FIG. 2 from that of FIG. 1 is the provision of a exclusive OR circuit 14.

In the semiconductor memory device of FIG. 2, the multi-bit test as in the semiconductor memory device of FIG. 19, as well as the line mode test as in the semiconductor memory device of FIG. 1, is possible. In the normal writing and reading, a switch 9b comprised of transistors is switched to the side of a contact a while the same is switched to the side of another contact b in the line mode test. In addition, the switch 9b is switched to the side of another contact c in the multi-bit test mode. Operation in the line mode test is the same as that of the semiconductor memory device in FIG. 1 and operation in the multi-bit test mode is the same as that of the semiconductor memory device in FIG. 19.

Figure 3:
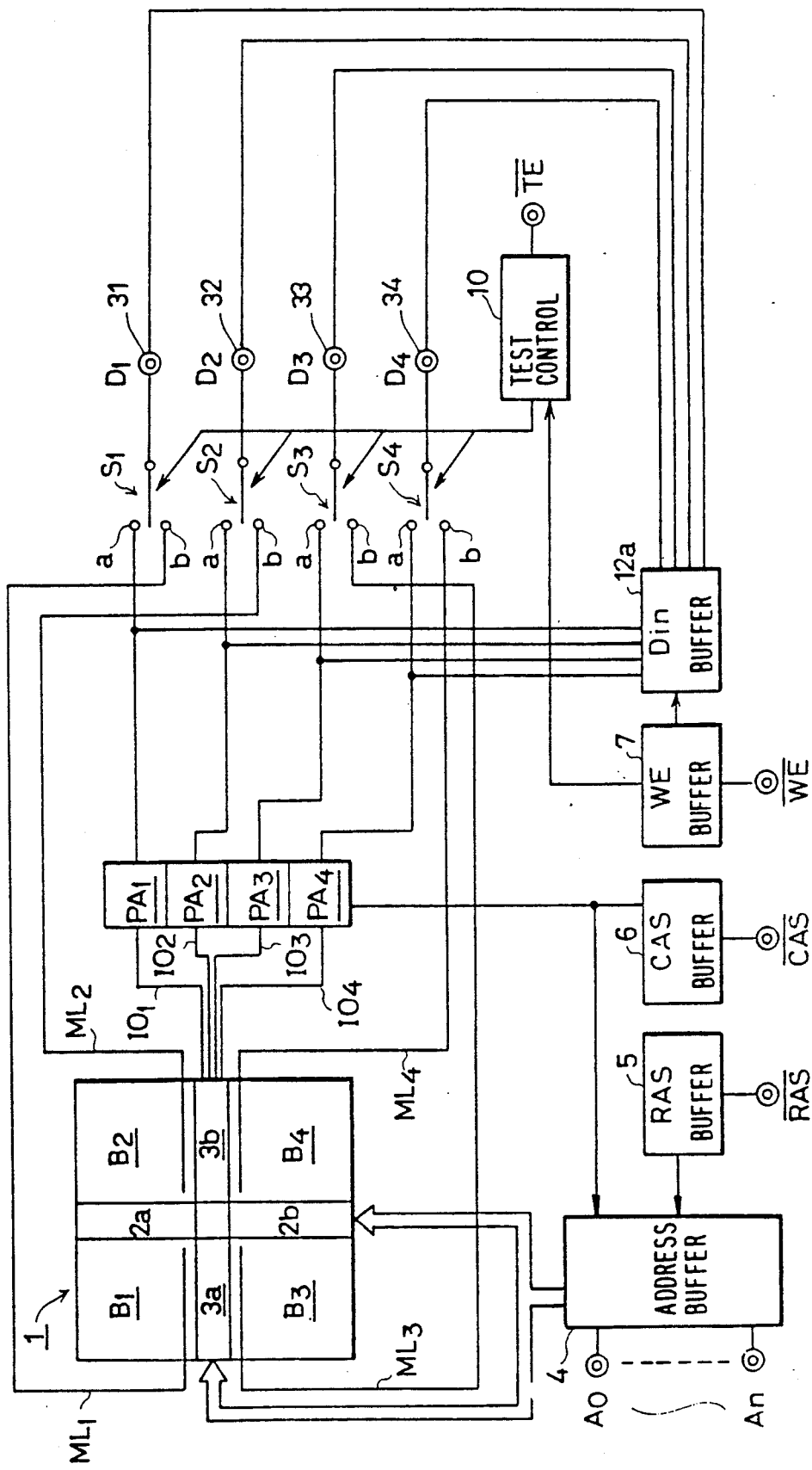
FIG. 3 is a block diagram showing the entire structure of a semiconductor memory device according to a third embodiment of the present invention.

FIG. 3 is a block diagram showing the entire structure of a semiconductor memory device according to a third embodiment of the present invention. This semiconductor memory device is of a type from and to which data of a four-bit word organization (X4 organization) can be read out and written in.

The structure of a memory array 1 is the same as that of the memory array 1 in the semiconductor memory device of FIG. 1. Four input/output line pairs I01 to I04 are provided corresponding to four memory array block B1 to B4. The input/output line pairs I01 to I04 are connected to input/output terminals 31 to 34 through preamplifiers PA1 to PA4 and switches S1 to S4, respectively. Furthermore, four match lines ML1 to ML4 are provided corresponding to the four memory array blocks B1 to B4. The match lines ML1 to ML4 are connected to contacts b of the switches S1 to S4, respectively.

In the normal writing and reading, the switches S1 to S4 are switched to the side of contacts a. In data writing, four-bit data B1 to B4 are applied to the input/output terminals 31 to 34. These data D1 to D4 are written in the memory cells in the corresponding memory array blocks B1 to B4 through the switches S1 to S4 and the input/output line pairs I01 to I04, respectively. In data reading, four pieces of data read out of the memory array blocks B1 to B4 are applied to the corresponding preamplifiers PA1 to PA4 through the input/output line pairs I01 to I04, respectively. The four-bit data are amplified by the preamplifiers PA1 to PA4 before transmitted to the input/output terminals 31 to 34 through the switches S1 to S4 and then outputted to the outside as output data D1 to D4.

In the line mode test, the switches S1 to S4 are switched to the side of contacts b by a test control circuit 10. Test data having been applied to the input/output terminals 31 to 34 are written in the memory array blocks B1 to B4 in parallel through a Din buffer 12a and the input/output line pairs I01 to I04, respectively. The line mode test is performed for the four memory array blocks B1 to B4 in parallel, test results of which are outputted to the match lines ML1 to ML4, respectively. The test results outputted to the match lines ML1 to ML4 are applied to the input/output terminals 31 to 34 through the switches S1 to S4, respectively. In this manner, the test results corresponding to the respective bits are outputted from the corresponding input/output terminals.

Figure 4:
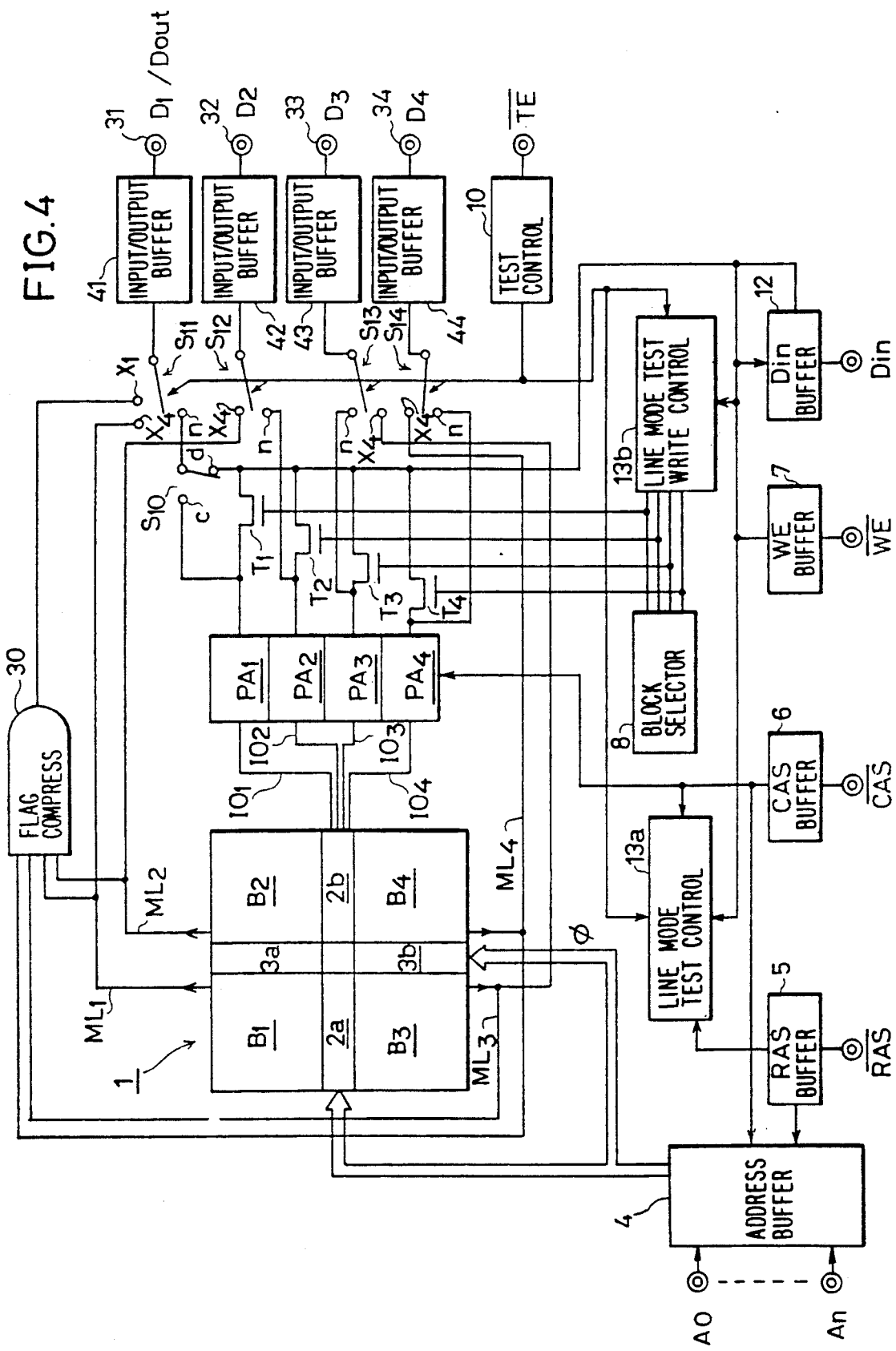
FIG. 4. is a block diagram showing the entire structure of a semiconductor memory device according to a fourth embodiment of the present invention.

FIG. 4 is a block diagram showing the entire structure of a semiconductor memory device according to a fourth embodiment of the present invention. This semiconductor memory device is of a type to and from which data of a one-bit word organization (X1 organization) and of a four-bit word organization (X4 organization) can be written in and read out on the same chip.

In FIG. 4, the structure of a memory array 1 is the same as that of the memory arrays 1 in the semiconductor memory devices of FIGS. 1 to 3. Input/output line pairs I01 to I04 are provided corresponding to memory array blocks B1 to B4. Furthermore, match lines ML1 to ML4 are provided corresponding to the memory array blocks B1 to B4. The match lines ML1 to ML4 are connected to contacts x4 of switches S11 to S14, respectively, as well as to input terminals of a flag compress 30. An output terminal of the flag compress 30 is connected to a contact x1 of the switch S11. An output terminal of a preamplifier PA1 is connected to another contact n of the switch S11 through a switch S10. Output terminals of preamplifiers PA1 to PA4 are connected to another contact d of the switch S10 and to a $D_{in}$ buffer 12 through transistors T1 to T4. The switches S11 to S14 are controlled by a test control circuit 10.

When this semiconductor memory device is set to the one-bit word organization, the switch S10 is switched to the side of the contact d and the switch S11 is switched to the side of the contact n. In writing, as in the semiconductor memory device of FIG. 1, data $D_{in}$ having been externally applied to the Din buffer 12 are written in the selected memory cells in one memory array block. In reading, the data having been stored in the selected memory cells in one memory array block are read out as output data $D_{out}$ to an input/output terminal 31 through an input/output buffer 41. In this case, only an output buffer in the input/output buffer 41 is activated.

When this semiconductor memory device is set to the four-bit word organization, the switch S10 is switched to the side of a contact c and the other switches S11 to S14 are switched to the side of contacts n. In writing, as in the semiconductor memory device of FIG. 3, data D1 to D4 having been externally applied to input/output terminals 31 to 34 are written in the selected memory cells in the corresponding memory array blocks B1 to B4 through input/output buffers 41 to 44, respectively. In reading, the data having been stored in the selected memory cells in the memory array block B1 to B4 are read out as output data B1 to B4 to the input/output terminals 31 to 34 through the input/output buffers 41 to 44, respectively.

In the line mode test of the semiconductor memory device having been set to the one-bit word organization, the switch S11 is switched to the side of the contact x1. In this case, as in the semiconductor memory device of FIG. 1, the line mode test is performed for the memory array blocks B1 to B4 in parallel, test results of which are outputted to the match lines ML1 to ML4, respectively. The flag compress 30 performs then AND operation on the outputs of the match line ML1 to ML4, results of which are outputted to the input/output terminal 31 through the switch S11 and the input/output buffer 41.

In the line mode test of the semiconductor memory device having been set to the four-bit word organization, the switches S11 to S14 are switched to the side of the contacts x4. In this case, as in the semiconductor memory device of FIG. 3, the line mode test is performed for the memory array blocks B1 to B4 in parallel, results of which are outputted to the match lines ML1 to ML4, respectively. The outputs of the match lines ML1 to ML4 are read out to the input/output terminals 31 to 34 through the input/output buffers 41 to 44, respectively.

Meanwhile, the line mode test in the memory array 1 is controlled by a line mode test control circuit 13a.

As described above, in the semiconductor memory device of FIG. 4, functions of the semiconductor memory devices in FIGS. 1 and 3 are achieved on the same chip. Meanwhile, also in the semiconductor memory device of FIG. 4, the multi-bit test may be applied providing a exclusive OR circuit 14 as the semiconductor memory device of FIG. 2.

Figure 5A:
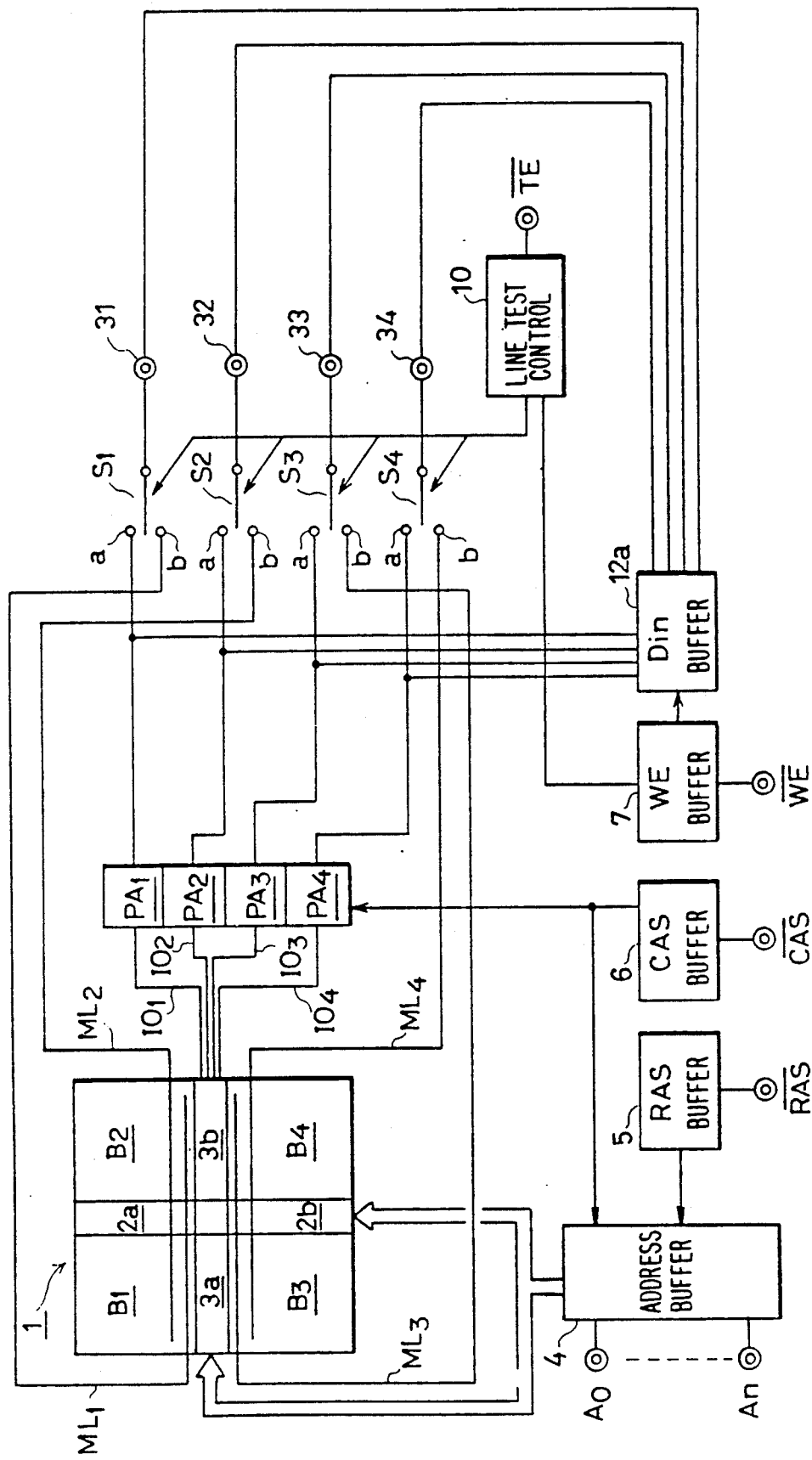
FIG. 5A is a block diagram showing the entire structure of a semiconductor memory device according to a fifth embodiment of the present invention.

FIG. 5A is a block diagram showing the entire structure of a semiconductor memory device according to a fifth embodiment of the present invention. This semiconductor memory device according to a fifth embodiment of the present invention. This semiconductor memory device is of a type to and from which data of four-bit word organization (x4 organization) can be written in and read out.

While in the semiconductor memory devices in FIGS. 3 and 4, data stored in one memory array are read out to the corresponding input/output terminal through the corresponding input/output line pair, in the semiconductor memory device of FIG. 5A, a plurality of input/output line pairs are provided to each memory array block. Therefore, each memory array block has a plurality of writing and reading paths. Correspondingly, each memory array block is provided with a plurality of match lines.

Figure 5B:
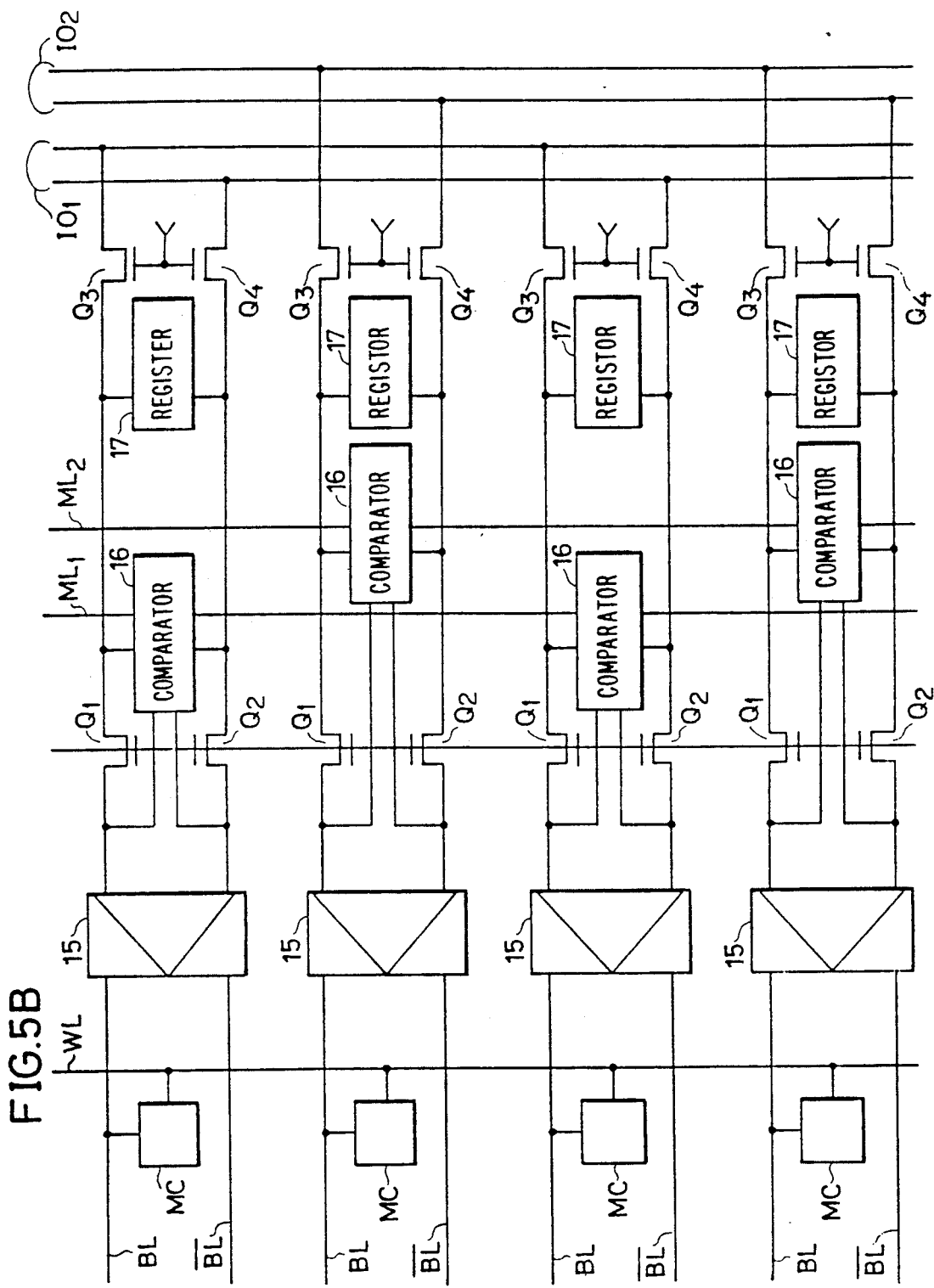
FIG. 5B is a circuit diagram showing a specific structure of memory array blocks in the semiconductor memory device of FIG. 5A.

A specific structure of the memory array block B1 in FIG. 5A is shown in FIG. 5B. Every second bit line pairs out of a plurality of bit line pairs BL and $\overline{BL}$ are connected to an input/output line pair I01 through other selective transistors Q1, Q2, Q3 and Q4. The remaining bit line paris among the plurality of bit line pairs BL and $\overline{BL}$ are connected to another input/output line pair I02 through the selective transistors Q1, Q2, Q3 and Q4. Furthermore, output terminals of comparators 16 corresponding to the every second bit line pairs are connected to a match line ML1 while output terminals of the other comparators 16 corresponding to the remaining bit line pairs are connected to another match line ML2.

Therefore, data stored in the memory array block B1 are read out through either the input/output line pair I01 or I02. Further, results of the line mode tests in the memory array block B1 are read out through either the match line ML1 or ML2.

In this embodiment, parasitic capacitance of each input/output line is small, so that access time can be short. In addition, since the same column decoded signal can be applied to adjacent two columns, the number of column decoders can be reduced.

Meanwhile, structure of the memory array block B2 is the same as that shown in FIG. 5B. On the other hand, in the memory array blocks B3 and B4, a plurality of bit line pairs BL and $\overline{BL}$ are connected not to the input/output line pairs I01 and I02 but to other input/output line pairs I03 and I04, and a plurality of comparators 16 are connected not to the match lines ML1 and ML2 but to other match lines ML3 and ML4.

Referring to FIG. 5A, in the normal writing and reading, switches S1 to S4 are connected to the side of contacts a. In the line mode test, the switches S1 to S4 are connected to the side of contacts b.

Meanwhile, by applying the memory array 1 of FIG. 5A to the semiconductor memory device in FIG. 4, a semiconductor memory device capable of being switched between the one-bit and the four-bit word organizations on the same chip can be implemented.

Figure 6:
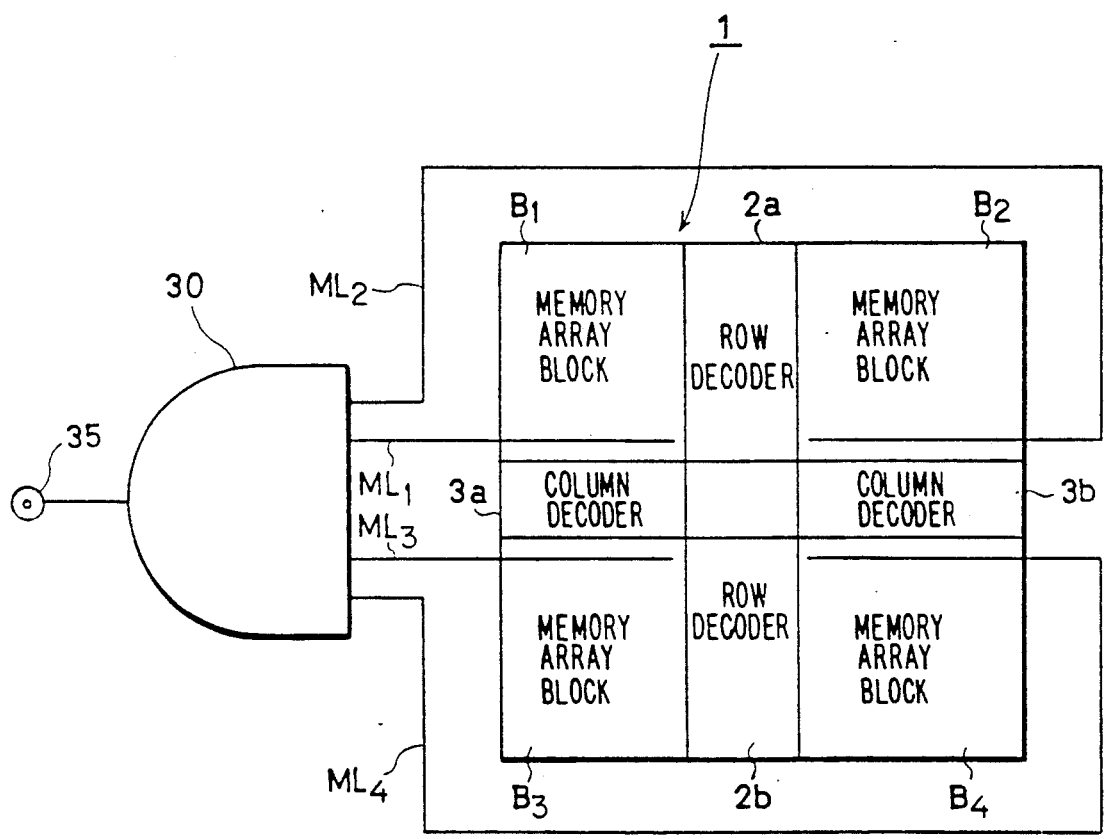
FIG. 6. is a block diagram showing a schematic structure of a semiconductor memory device according to a sixth embodiment of the present invention.

In the semiconductor memory devices of FIGS. 3 to 5A, when they are set to the four-bit word organization, the test results having been outputted on the match lines ML1 to ML4 are read out to the corresponding input/output terminals 31 to 34. On the other hand, as shown in FIG. 6, even when they are set to any multi-bit word organization, AND operation may be performed for the outputs of the match lines ML1 to ML4 by a flag compress 30, providing an output flag of the flag compress 30 to an external terminal 35.

While in the embodiments above, semiconductor memory devices of the one-bit and the four-bit word organizations have been described, the present invention may be applied to other semiconductor memory devices of an eight-bit word organization or the like in the same manner.

As described above, in the line mode test, different cycles from normal writing and reading cycles are executed, so that sequences for setting and resetting the respective cyc's are required. In the line mode test, sequences for setting and resetting a register mode, a copy write mode and a line read mode are necessary. In addition, the setting and resetting of the respective modes are required to be executed independently of each other.

FIG. 7 is a timing chart for explaining a sequence for setting and resetting the register mode.

In the register mode, test data writing and reading are performed to and from the registers 17 in FIG. 20. When the row address strobe signal $\overline{RAS}$ falls with the write enable signal $\overline{TE}$ at the "L" level and the write enable signal $\overline{WE}$ and the column address strobe signal $\overline{CAS}$ both at the "H" level, the register mode is set, while the same is reset when the row address strobe signal $\overline{RAS}$ falls with the test enable signal $\overline{TE}$, the write enable signal $\overline{WE}$ and the column address strobe signal $\overline{CAS}$ all at the "H" level.

FIG. 8 is a timing chart for explaining a sequence for setting and resetting the copy write mode.

When the row address strobe signal $\overline{RAS}$ falls with test enable signal $\overline{TE}$ and the write enable signal $\overline{WE}$ both at the "L" level and the column address strobe signal $\overline{CAS}$ at the "H" level, the copy write mode is set, while the same is reset when the row address strobe signal $\overline{RAS}$ falls with the test enable signal $\overline{TE}$, the write enable signal $\overline{WE}$ and the column address strobe signal $\overline{CAS}$ fall at the "H" level.

FIG. 9 is a timing chart for explaining a sequence for setting and resetting the line read mode.

When the row address strobe signal $\overline{RAS}$ falls with the test enable signal $\overline{TE}$ at the "H" level and the write enable signal $\overline{WE}$ and the column address strobe signal $\overline{CAS}$ both at the "L" level, a set cycle is started. When the row address strobe signal $\overline{RAS}$ falls with the test enable signal $\overline{TE}$ at the "L" level and the write enable signal $\overline{WE}$ and the column address strobe signal $\overline{CAS}$ both at the "H" level, the line mode test is set, starting a line mode cycle. When the row address strobe signal $\overline{RAS}$ falls with the test enable signal $\overline{TE}$ at the "H" level, a reset cycle is started at a timing of the RAS only refresh.

In a semiconductor memory device capable of the multi-bit test as well as the line mode test as described with the embodiment of FIG. 2, a sequence for setting and resetting the multi-bit test is necessary. FIG. 10 is a timing chart for explaining a sequence for setting and resetting the multi-bit test.

As shown in FIG. 10, a set cycle is started in the same manner as in the line read mode of FIG. 9. When the row address strobe signal $\overline{RAS}$ falls with the test enable signal $\overline{TE}$, the write enable signal $\overline{WE}$ and the column address strobe signal $\overline{CAS}$ all at the "H" level, a test cycle of the multi-bit test is started. Also, a reset cycle is started at the same timing as that in the line read mode in FIG. 9.

Figure 11:
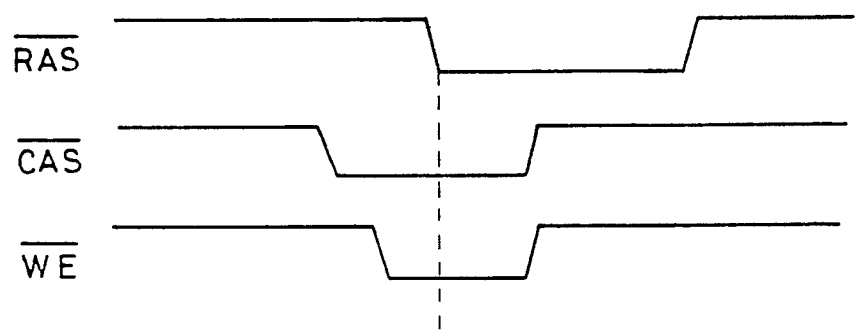
FIG. 11 is a timing chart for explaining another sequence example of set in the multi-bit test.
Figure 12:
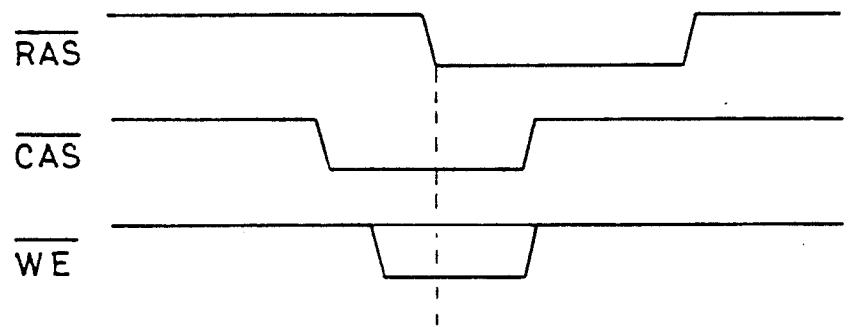
FIG. 12 is a timing chart for explaining another sequence example of reset in the multi-bit test.

Meanwhile, for a 4M bit dynamic RAM (Random Access Memory), there are standardized methods for setting and resetting the multi-bit test mode as shown in FIGS. 11 and 12.

As shown in FIG. 11, when the row address strobe signal $\overline{RAS}$ falls with the column address strobe signal $\overline{CAS}$ and the write enable signal $\overline{WE}$ both at the "L" level (write CAS-before-RAS), the multi-bit test mode is set. Further, as shown in FIG. 12, the multi-bit test mode is reset at a timing of the write $\overline{CAS}$ before-RAS or the RAS only refresh mode. In the multi-bit test, the setting and resetting are performed according to the same sequence regardless of writing or reading.

Meanwhile, the semiconductor memory devices according to the embodiments above may also be set to the several modes through other methods than those described above. For example, by applying a predetermined voltage (super $V_{cc}$) above supply voltage to the external pin which receives the test enable signal $\overline{TE}$, setting to any of the modes may be effected.

Subsequently, methods of outputting the test results in the semiconductor memory devices according to the embodiments above will be described with reference to the timing charts in FIGS. 13 to 16 and the block diagrams in FIGS. 17 and 18.

Figure 13:
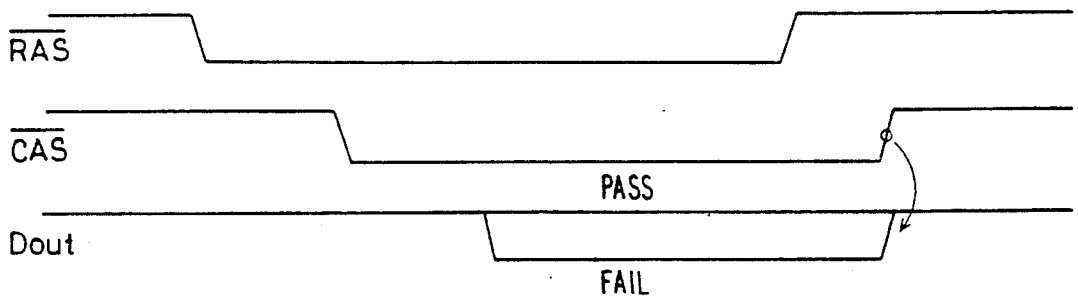
FIG. 13 is a timing chart showing a first example of a test result output method.
Figure 14:
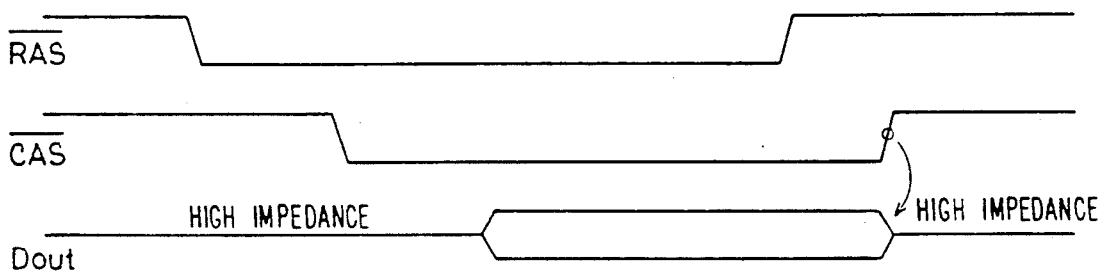
FIG. 14 is a timing chart showing a second example of the test result output method.
Figure 15:
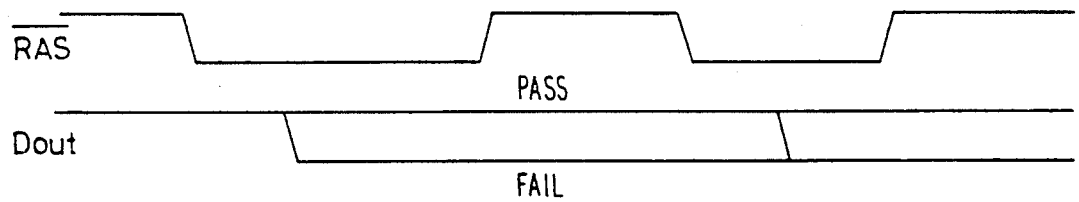
FIG. 15 is a timing chart showing a third example of the test result output method.
Figure 16:
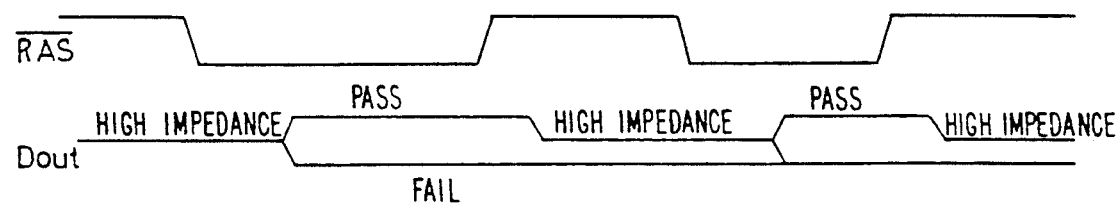
FIG. 16 is a timing chart showing a fourth example of the test result output method.
Figure 17:
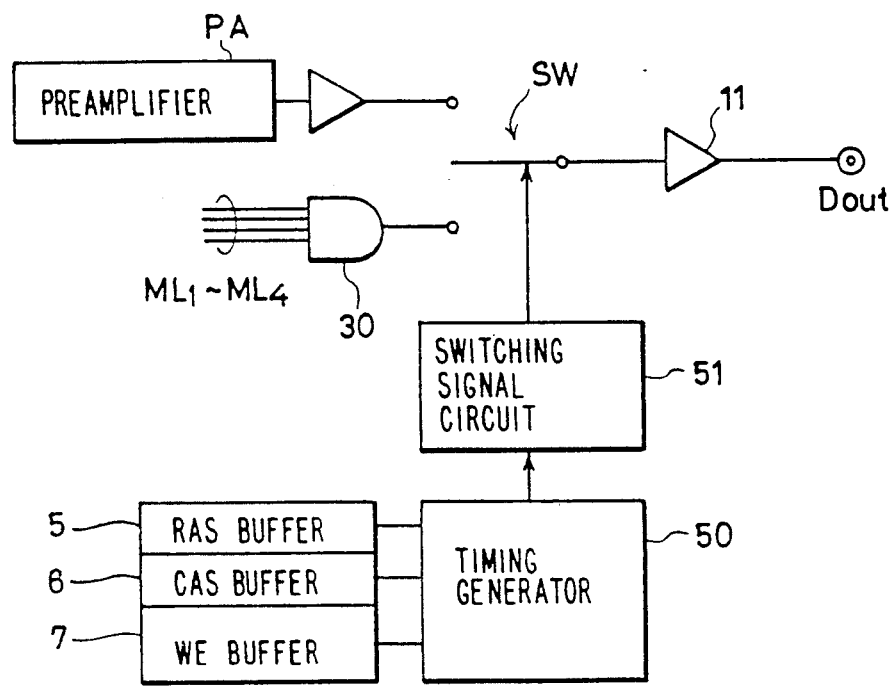
FIG. 17 is a block diagram showing a structure for executing the methods of FIGS. 13 and 15.
Figure 18:
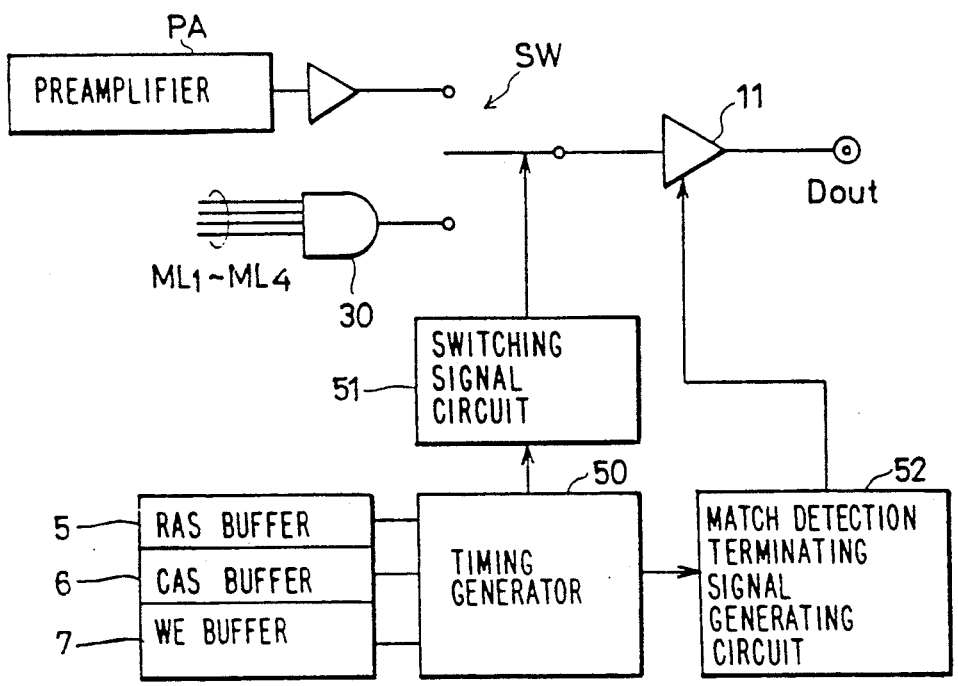
FIG. 18 is a block diagram showing a structure for executing the methods of FIGS. 14 and 16.

FIG. 17 is a block diagram showing a structure for executing the methods shown in FIGS. 13 and 15. FIG. 18 is a block diagram showing a structure for executing the methods of FIGS. 14 and 16.

In precharging, match lines ML1 to ML4 have potentials of the "H" level, so that a flag compress 30 outputs an "H" level.

According to the method of FIG. 13, a switch SW in FIG. 17 is switched by a switching signal circuit 51 to the side of an output terminal of the flag compress 30 during the precharge period. This allows output of an output buffer 11 to hold the "H" level. After execution of the line mode test, the output of the output buffer 11 keeps holding the "H" level as long as there exists no error, while the same is turned to the "L" level on occurrence of any error. In this manner, the test results are determined. The switching signal circuit 51 is controlled by a timing generator 50 which operates in response to outputs of a RAS buffer 5, a CAS buffer 6 and a WE buffer 7.

According to the method shown in FIG. 14, output of an output buffer 11 constituted of a tristate buffer is held in a high impedance state by a match detection terminating signal generating circuit 52 during the precharge period. After the results of the line mode test are transmitted to a flag compress 30 through match lines ML1 to ML4, the high impedance state of the output buffer 11 is cancelled. As a result, the output of the output buffer 11 is at the "H" level when there is no error, while the same is turned to the "L" level on occurrence of any error.

Meanwhile, according to the methods in FIGS. 13 and 14, a flag outputted from the output buffer 11 is reset in response to fall of the column address strobe signal $\overline{CAS}$.

While according to the methods in FIGS. 13 and 14, an error flag is reset for every RAS cycle, according to the methods in FIGS. 15 and 16, an output of the "L" level is latched upon occurrence of an error.

Meanwhile, the match detection terminating signal generating circuit 52 is controlled by a timing generator 50.

According to the embodiments above, the line mode test is performed in parallel for the plurality of memory array blocks in the semiconductor memory devices of the one-bit and the multi-bit word organizations, so that the test time will be considerably reduced.

As has been described in the foregoing, according to the present invention, in a semiconductor memory device having a memory array divided into a plurality of blocks, a number of memory cells in each block are simultaneously tested, so that the test time will be considerably reduced.

Furthermore, in a semiconductor memory device of a multi-bit word organization, a number of memory cells in each block . e simultaneously tested, so that the test time will be considerably reduced.

Additionally, in a semiconductor memory device of a multi-bit word organization and comprising blocks to

What is claimed is:

1. A semiconductor memory device comprising:
   a memory array comprising a plurality of memory cells arranged in a plurality of rows and columns, and divided into a plurality of blocks;
   a plurality of test means provided to correspond respectively to said plurality of blocks, each of said test means testing simultaneously a plurality of memory cells in the corresponding block; and
   logic means for performing a predetermined logic operation on a plurality of results of said plurality of test means and outputting the operation result as a test result for all the blocks,
   each of said plurality of test means including
   (i) information holding means provided in the corresponding block for holding information of one row,
   (ii) comparison means provided in the corresponding block for comparing information read out of the memory cells of a selected row with the information held in said information holding means, and
   (iii) match lines to which the comparison results of said comparison means are outputted.

2. The semiconductor memory device according to claim 1, wherein
   said information holding means comprises:
   a plurality of registers provided to correspond to the plurality of columns in the corresponding block, and
   said comparison means comprises:
   a plurality of match detecting means provided to correspond to the plurality of columns in the corresponding block.

3. A semiconductor memory device to and from which information of a word organization composed of a plurality of bits can be written and read out, comprising:
   a memory array comprising a plurality of memory cells arranged in a plurality of rows and columns, and divided into a plurality of blocks corresponding to said plurality of bits;
   a plurality of test means provided to correspond respectively to said plurality of blocks, each of said test means testing simultaneously a plurality of memory cells in the corresponding block; and
   a plurality of test result output means for outputting a plurality of test results of said plurality of test means,
   each of said plurality of test means including
   (i) information holding means provided in the corresponding block for holding information of one row,
   (ii) comparison means provided in the corresponding block for comparing information read out of the memory cells of a selected row with the information held in said information holding means, and
   match lines to which the comparison results of said comparison means are outputted.

4. The semiconductor memory device according to claim 3, wherein
   said information holding means comprises:
   a plurality of registers provided to correspond to the plurality of columns in the corresponding block, and
   said comparison means comprises:
   a plurality of match detecting means provided to correspond to the plurality of columns in the corresponding block.

5. A semiconductor memory device comprising:
   a memory array comprising a plurality of memory cells arranged in a plurality of rows and columns, and divided into a plurality of blocks;
   a plurality of test means provided to correspond respectively to said plurality of blocks said test means operating in parallel with each other for simultaneously testing a plurality of memory cells in respective blocks; and
   logic means for performing a predetermined logic operation on a plurality of results of said plurality of test means and outputting the operation result as a test result for all the blocks.

6. The semiconductor memory device according to claim 5, wherein
   each of said plurality of test means performs a line mode test in which the memory cells of a selected row in the corresponding block are simultaneously tested.

7. The semiconductor memory device according to claim 5, wherein
   said logic means performs an AND operation.

8. The semiconductor memory device according to claim 1, further comprising:
   control means for controlling operation of said plurality of test means and said logic means according to a plurality of externally applied control signals.

9. A semiconductor memory device to and from which information of a word organization composed of a plurality of bits can be written and read out, comprising:
   a memory array comprising a plurality of memory cells arranged in a plurality of rows and columns, and divided into a plurality of blocks corresponding to said plurality of bits;
   a plurality of test means provided to correspond respectively to said plurality of blocks, said test means operating in parallel with each other for simultaneously testing a plurality of memory cells in respective blocks; and
   a plurality of test result output means for outputting a plurality of test results of said plurality of test means.

10. The semiconductor memory device according to claim 9, wherein
    each of said plurality of test mean performs a line mode test in which the memory cells of a selected row in the corresponding block are simultaneously tested.

11. The semiconductor memory device according to claim 9, furth comprising:
    logic means for performing a predetermined logic operation on the plurality of test outputted from said plurality of test result output means and outputting the operation results as test results for all the blocks.

12. The semiconductor memory device according to claim 9, further comprising:
control means for controlling operation of said plurality of test means and said plurality of test result output means according to a plurality of externally applied control signals.

13. A semiconductor memory device to and from which information of a word organization composed of a plurality of bits can be written in and read out, comprising:
a memory array comprising a plurality of memory cells arranged in a plurality of rows and columns, and divided into a plurality of blocks;
a plurality of input/output means provided to correspond to said plurality of bits,
each memory cell Comprised in each of said block being connected to any of said plurality of input/output means
a plurality of test means provided to correspond respectively to said plurality of input/output means each of said test means testing the plurality of memory cells connected to the corresponding input/output means simultaneously; and
a plurality of test result output means provided to correspond to said plurality of input/output means for outputting a plurality of test results of said plurality of test means.

14. The Semiconductor memory device according to claim 13, wherein
each of said plurality of test means performs a line mode test in which the memory cells of a selected row in the corresponding block are simultaneously tested.

15. The Semiconductor memory device according to claim 13, wherein
each of said plurality of test means comprises:
information holding means provided in the corresponding block for holding information of one row;
comparison means provided in the corresponding block for comparing information read out of the memory cells of a selected row with the information held in said information holding means; and
match lines to which the comparison results of said comparison means are outputted.

16. The semiconductor memory device according to claim 15, wherein
said information holding means comprises:
a plurality of registers provided to correspond to the plurality of columns in the corresponding block, and
said comparison means comprises:
a plurality of match detecting means provided to correspond to the plurality of columns in the corresponding block.

17. The semiconductor memory device according to claim 13, further comprising:
logic means performing a predetermined logic operation on the plurality of test results outputted from said plurality of test result output means and outputting the operation results as test results for all the blocks.

18. The semiconductor memory device according to claim 13, further comprising:
control means for controlling operation of said plurality of input/output means, said plurality of test means and said plurality of test result output means according to a plurality of externally applied control signals.

19. A semiconductor memory device comprising:
a memory array comprising a plurality of memory cells arranged in a plurality of rows and columns, and divided into a plurality of blocks;
a plurality of test means provided to correspond respectively to said plurality of blocks, each of said test means testing simultaneously a plurality of memory cells in the corresponding block;
logic means for performing a predetermined logic operation on a plurality of results of said plurality of test means and outputting the operation result as a test result for all the blocks;
block selecting means; and
input/output means for simultaneously providing externally applied information to said plurality of blocks in testing, and in normal operation, providing the externally applied information to the block selected by said block selecting means or outputting information read out of the block selected by said block selecting means to the outside.

20. The semiconductor memory device according to claim 19, further comprising:
match detecting means for detecting match or mismatch between a plurality of pieces of information read out of said plurality of blocks.

21. The semiconductor memory device according to claim 19, further comprising:
first selecting means for selecting any of the plurality of rows in each of said blocks; and
second selecting means for selecting any of the plurality of columns in each of said blocks.

22. The semiconductor memory device according to claim 19, further comprising:
control means for controlling operation of said plurality of test means, said plurality of test result output means and said plurality of input/output means according to combination of a plurality of externally applied control signals.

23. A semiconductor memory device which is selectively set to a first state where one-bit information can be read out or written in and to a second state where multi-bit information can be read out or written in, comprising:
a memory array comprising a plurality of memory cells arranged in a plurality of rows and columns, and divided into a plurality of blocks corresponding to said plurality of bits;
a plurality of test means provided to correspond respectively to said plurality of blocks each of said test mean testing simultaneously a plurality of memory cells in the corresponding block; and
test result output means for outputting a plurality of test results of said plurality of test means when said first state has been set, and when said second state has been set, performing a predetermined logic operation on the plurality of test results of said plurality of test means and outputting the operation results as test results for all the blocks.

24. The semiconductor memory device according to claim 23, wherein
each of sai' plurality of test means performs a line mode test in which the memory cells of a selected row in the corresponding block are simultaneously tested.

25. The semiconductor memory device according to claim 23, wherein
each of said plurality of test means comprises:
information holding means provided in the corresponding block for holding information of one row;
comparison means provided int he corresponding block for comparing information read out of the memory cells of a selected row with the information held in said information holding means; and
match lines to which the comparison results of said comparison means are outputted.

26. The semiconductor memory device according to claim 25, wherein
said information holding means comprises:
a plurality of registers provided to correspond to the plurality of columns in the corresponding block, and
said comparison means comprises:
a plurality of match detecting means provided to correspond to the plurality of columns in the corresponding block.

27. The semiconductor memory device according to claim 23, wherein
said predetermined logic operation is an AND operation.

28. The semiconductor memory device according to claim 23, further comprising:
block selecting means for selecting any of said plurality of blocks; and
input/output means for simultaneously providing externally applied information to said plurality of blocks in testing, providing the externally applied information to the block selected by said block selecting means or outputting information read out of the block selected by said block selecting means to the outside when said first state has been set, and providing the externally applied information to said plurality of blocks or outputting information read out of said plurality of blocks to the outside when said second state has been set.

29. The semiconductor memory device according to claim 28, further comprising:
control means for controlling operation of said plurality of test means, said plurality of test result output means and said plurality of input/output means according to combination of a plurality of externally applied control signals.

30. The semiconductor memory device according to claim 23, wherein
said test result output means further performs the predetermined logic operation on the plurality of test results of said plurality of test means and outputting the operation results as test results for all the blocks even when said first state has been set.

31. A semiconductor memory device, comprising:
a memory array comprising a plurality of memory cells arranged in a plurality of rows and columns, and divided into a plurality of blocks;
a plurality of test means provided to correspond respectively to said plurality of blocks each of said test means testing simultaneously a plurality of memory cells in the corresponding block;
test result output means for outputting test result of said plurality of test means; and
output control means for ordinarily setting the output from said test result output means at a predetermined logic level, and outputting the test result from said test result output means at the time of an output operation of the test result.

32. A semiconductor memory device according to claim 31, wherein
said output control means resets the test result after said output operation of the test result is completed.

33. A semiconductor memory device according to claim 31, wherein
said output control means holds the test result when the test result indicates the fail after said output operation of the test result is completed.

34. A semiconductor memory device, comprising:
a memory array comprising a plurality of memory cells arranged in a plurality of rows and columns, and divided into a plurality of blocks;
a plurality of test means provided to correspond respectively to said plurality of blocks each of said test means testing simultaneously a plurality of memory cells in the corresponding block;
test result output means for outputting test result of said plurality of test means; and
output control means for ordinarily setting the output from said test result output means in the high impedance state, and outputting the test result from said test result output means at the time of an output operation of the test result.

35. A semiconductor memory device according to claim 34, wherein
said output control means resets the test result after said output operation of the test result is completed.

36. A semiconductor memory device according to claim 34, wherein
said output control means holds the test result when the test result indicates the fail after said output operation of the test result is completed.

37. A semiconductor device, comprising:
a memory array comprising a plurality of memory cells arranged in a plurality of rows and columns and divided into a plurality of blocks;
a plurality of line mode test means corresponding to the plurality of blocks, said line mode test means operable in parallel with each other, each including means for simultaneously testing a plurality of cells arranged along a common line in its block and producing, in parallel with others of said line mode test means, a line mode test output signal; and
means for combining line mode test signals simultaneously produced by said plurality of line mode test means to produce an output signal as a test result for all of said blocks.

38. A semiconductor memory device for storing data composed of a word organization composed of a plurality of bits, comprising:
a memory array comprising a plurality of memory cells arranged in a plurality of rows and columns and divided into a plurality of blocks;
a plurality of line mode test means corresponding to respective ones of the plurality of blocks and operable in parallel with each other, said line mode test means including respective means for simultaneously testing a plurality of cells arranged along a common line in its block and producing a line mode test outp . signal; and
means for reading out line mode test signals simultaneously produced by said plurality of line mode test means.

39. A semiconductor memory device operative selectively in single or multiple bit word organization modes, comprising:

a memory array comprising a plurality of memory cells arranged in a plurality of rows and columns and divided into a plurality of blocks;

a plurality of line mode test means corresponding to the plurality of blocks, each of said line mode test means including means for testing simultaneously a plurality of cells arranged along a common line in its block and producing a line mode test output signal;

means for combining line mode test signals simultaneously produced by said plurality of line mode test means to produce an output signal as a test result for all of said blocks when said memory device is in the single bit word organization mode; and means for reading out line mode test signals simultaneously produced by said plurality of line mode test means when said memory device is in the multiple bit word organization mode.

40. A semiconductor memory device comprising:

a plurality of memory blocks, each comprising (i) a plurality of memory cells arranged in a plurality of rows and columns and (ii) sense amplifier means for supplying an output signal from said memory cells of a respective block;

a plurality of test means provided to correspond respectively to said plurality of blocks, each of said test means simultaneously testing a plurality of memory cells in a respective block and, in response, said test means simultaneously supplying respective block test signals; and logic means responsive to said block test signals for supplying a combined test result signal from all of the memory blocks.

* * * * *